United States Patent
Plumb et al.

(10) Patent No.: US 10,411,831 B2
(45) Date of Patent: Sep. 10, 2019

(54) WIRELESS POWER TRANSFER IN-BAND COMMUNICATION SYSTEM

(71) Applicant: MEDIATEK Singapore Pte. Ltd., Solaris (SG)

(72) Inventors: William Plumb, Charlestown, MA (US); Zhen Wang, Framingham, MA (US); Zoran Zvonar, Boston, MA (US); Patrick Stanley Riehl, Lynnfield, MA (US); Anand Satyamoorthy, Somerville, MA (US); Philip Frank Tustin, North Andover, MA (US)

(73) Assignee: MEDIATEK Singapore Pte. Ltd., Singapore (SG)

( * ) Notice: Subject to any disclaimer, the term of this patent is extended or adjusted under 35 U.S.C. 154(b) by 0 days.

(21) Appl. No.: 14/215,084

(22) Filed: Mar. 17, 2014

(65) Prior Publication Data

US 2014/0269886 A1    Sep. 18, 2014

Related U.S. Application Data

(63) Continuation-in-part of application No. PCT/US2013/066721, filed on Oct. 25, 2013.
(Continued)

(51) Int. Cl.
*H04L 1/00* (2006.01)
*H04L 25/06* (2006.01)
(Continued)

(52) U.S. Cl.
CPC ............ *H04L 1/0042* (2013.01); *H03M 5/12* (2013.01); *H03M 5/145* (2013.01);
(Continued)

(58) Field of Classification Search
CPC ............ H03M 13/1505; H04L 1/0042; H04L 25/03834; H04L 7/0087; H04L 25/03; H03H 7/40; H03H 7/42
(Continued)

(56) References Cited

U.S. PATENT DOCUMENTS 4,596,023 A * 6/1986 Driver ..................... H03M 5/12
                                                      327/178
4,598,396 A * 7/1986 Upp ........................ H04B 3/548
                                                      370/284
(Continued)

FOREIGN PATENT DOCUMENTS

CN         102474134 A       5/2012

OTHER PUBLICATIONS

"International Search Report" dated May 1, 2014 for International application No. PCT/US13/66721, International filing date:Oct. 25, 2013.
(Continued)

*Primary Examiner* — Patrick N Edouard
*Assistant Examiner* — Eboni Hughes
(74) *Attorney, Agent, or Firm* — Wolf, Greenfield & Sacks, P.C.

(57) ABSTRACT

A wireless charging in-band communication system includes a channel encoding for message error correction and detection. A modulation module performs biphase modulation for DC balanced signals and impedance switching to change reflected impedance seen by the source. A synchronization module prepends the message with a synchronization sequence having Golay complementary codes. A receiver module receives the message from the transmitter module. A preamble detection block has a Golay complementary code correlator used for message detection, synchronization, and equalization coefficient estimation and
(Continued)

selection. A decoding module that performs biphase demodulation with error correction with a DC offset being estimated as the average value of the signal over the length of the message before channel decoding. The decoding module performs equalization, error correction and detection channel decoding.

46 Claims, 24 Drawing Sheets

Related U.S. Application Data

(60) Provisional application No. 61/718,943, filed on Oct. 26, 2012, provisional application No. 61/791,014, filed on Mar. 15, 2013.

(51) Int. Cl.
    *H04L 25/03*     (2006.01)
    *H04L 7/00*     (2006.01)
    *H03M 5/12*     (2006.01)
    *H03M 5/14*     (2006.01)
    *H03M 13/15*     (2006.01)
    *H03M 13/19*     (2006.01)
    *H04L 7/04*     (2006.01)

(52) U.S. Cl.
    CPC ......... *H03M 13/152* (2013.01); *H03M 13/19* (2013.01); *H04L 1/0041* (2013.01); *H04L 1/0045* (2013.01); *H04L 1/0057* (2013.01); *H04L 7/0058* (2013.01); *H04L 7/0087* (2013.01); *H04L 7/042* (2013.01); *H04L 25/03834* (2013.01); *H04L 25/061* (2013.01)

(58) Field of Classification Search
    USPC ................ 375/232–233, 259, 316, 333, 347, 375/354–357, 359, 373; 370/252, 370/328–329, 335, 338, 349–350
    See application file for complete search history.

(56) References Cited

U.S. PATENT DOCUMENTS

| | | | | |
|---|---|---|---|---|
| 6,782,300 | B2* | 8/2004 | Pillay | H04L 7/0331 375/333 |
| 6,851,086 | B2* | 2/2005 | Szymanski | H03M 13/09 714/781 |
| 8,208,577 | B2 | 6/2012 | Calvin | |
| 9,225,060 | B2* | 12/2015 | Bair | H01Q 1/242 |
| 9,363,041 | B2 | 6/2016 | Plumb et al. | |
| 2002/0159413 | A1* | 10/2002 | Tsubouchi | H04B 7/2628 370/335 |
| 2003/0195645 | A1 | 10/2003 | Pillay et al. | |
| 2009/0108992 | A1 | 4/2009 | Shafer | |
| 2011/0031928 | A1 | 2/2011 | Soar | |
| 2011/0266880 | A1 | 11/2011 | Kim et al. | |
| 2012/0033714 | A1* | 2/2012 | Lakkis | H04B 1/71632 375/147 |
| 2012/0161539 | A1* | 6/2012 | Kim | H02J 17/00 307/104 |
| 2012/0293118 | A1* | 11/2012 | Kim | H02J 5/005 320/108 |
| 2012/0306286 | A1* | 12/2012 | Kim | H02J 7/007 307/104 |
| 2013/0260676 | A1* | 10/2013 | Singh | H04B 5/0037 455/41.1 |
| 2013/0272343 | A1* | 10/2013 | Zhang | H04L 25/0212 375/148 |
| 2014/0016719 | A1* | 1/2014 | Manku | G06K 19/0723 375/295 |
| 2014/0269886 | A1 | 9/2014 | Plumb et al. | |
| 2014/0314170 | A1 | 10/2014 | Plumb et al. | |
| 2015/0009018 | A1* | 1/2015 | Manku | H04L 27/04 340/10.1 |
| 2016/0254696 | A1 | 9/2016 | Plumb et al. | |

OTHER PUBLICATIONS

Supplementary European Search Report for European Application No. 13848848.1 dated Jul. 8, 2016
International Search Report and Written Opinion for International Application No. PCT/US13/66721 dated May 1, 2014.
International Preliminary Report on Patentability for International Application No. PCT/US13/66721 dated May 7, 2015.
Regan et al., Current Sense Circuit Collection, Making Sense of Current. Linear Technology. Application Note 105. Dec. 2005: 118 pages.

\* cited by examiner

| Barker code | | | | | | | | | | | | | Comment |
|---|---|---|---|---|---|---|---|---|---|---|---|---|---|
| +1 | +1 | +1 | +1 | +1 | -1 | -1 | +1 | +1 | -1 | +1 | -1 | +1 | 13 bit Barker code |
| -1 | -1 | -1 | -1 | -1 | +1 | +1 | -1 | -1 | +1 | -1 | +1 | -1 | Inverted 13 bit barker code |

| 2x8 bit Golay complementary code | | | | | | | |
|---|---|---|---|---|---|---|---|
| +1 | -1 | +1 | +1 | -1 | +1 | +1 | +1 |
| -1 | +1 | -1 | -1 | -1 | +1 | +1 | +1 |

| (HB_2n+1, HB_2n) > 0 | HB_2n >= HB_2n+1 | HB_2n | HB_2n + 1 |
|---|---|---|---|
| 0 | 0 | 1 | -1 |
| 0 | 1 | -1 | 1 |
| 1 | 0 | -1 | 1 |
| 1 | 1 | 1 | -1 |

| Steps for biphase decoding with error correction |
|---|
| 1. Samples for each half bit are accumulated |
| 2. The first halfbit of each bit ($HB_{2n+1}$) is compared in magnitude to the previous halfbit ($HB_{2n}$) - i.e. last halfbit in the previous bit |
| 3. If ($HB_{2n} >= HB_{2n+1}$)<br>　　$HB_{2n} = -1 * HB_{2n}$ |
| 4. If ($HB_{2n} < HB_{2n+1}$)<br>　　$HB_{2n+1} = -1 * HB_{2n+1}$ |
| 5. Decode biphase signal as usual if a transition occurs at the half bit period then the bit is a '1' otherwise the bit is a '0'<br><br>　If [($HB_{2n-1}>0$) and ($HB_{2n}<=0$)] or [($HB_{2n-1}<=0$) and ($HB_{2n}>0$)]<br>　　Bit='1'<br><br>　If [($HB_{2n-1}>0$) and ($HB_{2n}>0$)] or [($HB_{2n-1}<=0$) and ($HB_{2n}<=0$)]<br>　　Bit='0' |

FIG. 27

WIRELESS POWER TRANSFER IN-BAND COMMUNICATION SYSTEM

CROSS REFERENCE TO RELATED APPLICATIONS

This application is a continuation-in-part of PCT Application Ser. No. PCT/US13/66721 (which claims priority from U.S. provisional application Ser. No. 61/718,943 filed Oct. 26, 2012), and claims priority from U.S. provisional application Ser. No. 61/791,014 filed Mar. 15, 2013, all of which are incorporated herein by reference in their entireties.

BACKGROUND OF THE INVENTION

The invention is related to the field of wireless power transfer systems, and in particular a wireless power transfer in-band communication system that provides robust communications channel to be embedded in the case where energy is transferred from a Source to a Load without a physical connection.

Current wireless power transfer (also referred to as wireless charging) on the market (Qi) employs communication system based on a classic asynchronous serial communication interface with a start/stop bit or indication and little or no protection on the data transmitted. This serial communication is specified by the Wireless Power Consortium (WPC).

SUMMARY OF THE INVENTION

According to one aspect of the invention, there is provided a wireless charging in-band communication system. The wireless charging in-band communication system includes a transmitter module that formats a message. The transmitter includes channel encoding for message error correction and detection. A modulation module performs biphase modulation for DC balanced signals and impedance switching to change reflected impedance seen by the source. A synchronization module prepends the message with a synchronization sequence having Golay complementary codes. A receiver module receives the message from the transmitter module. The receiver module includes an impedance sensing circuit to detect changes in the reflected impedance of the transmitter module. The receiver module includes a front end filter used for pulse shaping and noise rejection. A preamble detection block has a Golay complementary code correlator used for message detection, synchronization, and equalization coefficient estimation and selection. A decoding module that performs biphase demodulation with error correction with a DC offset being estimated as the average value of the signal over the length of the message before channel decoding. The decoding module performs equalization, error correction and detection channel decoding.

According to another aspect of the invention, there is provided a method of performing the operations of a wireless charging in-band communication system. The method includes formatting a message, and performing biphase modulation for DC balanced signals using a modulation module, including impedance switching to change reflected impedance seen by the source. Also, the method includes prepending the message with a synchronization sequence having Golay complementary codes using a synchronization module, and receiving the message from the transmitter module using a receiver module. An impedance sensing circuit is provided to detect changes in the reflected impedance of the transmitter module. A front end filter is provided that is used for pulse shaping and noise rejection. In addition, the method includes using a Golay complementary code correlator for message detection, synchronization, and equalization coefficient estimation and selection, and performing biphase demodulation with error correction with a DC offset being estimated as the average value of the signal over the length of the message before channel decoding using a biphase demodulator module. Furthermore, the method includes performing equalization, error correction channel decoding and detection.

According to another aspect of the invention, there is provided a transmitter. The transmitter supports wireless charging in-band communication with a receiver. The transmitter comprises a channel encoding module for message error correction and detection, a modulation module for performing modulation and impedance switching to change reflected impedance seen by the receiver, and a synchronization module for prepending the message with a synchronization sequence.

According to another aspect of the invention, there is provided a receiver. The receiver supports wireless charging in-band communication with a transmitter. The receiver comprises a sensing circuit for detecting characteristics changes of the transmitter, a front end filter for pulse shaping and noise rejection, a preamble detection block having a correlator used for message detection, synchronization, and equalization coefficient estimation and selection, and a decoding module for performing demodulation with error correction, equalization, and channel decoding.

BRIEF DESCRIPTION OF THE DRAWINGS

FIG. 27 is a table illustrating the steps for biphase decoding with error correction and DC offset compensation.

DETAILED DESCRIPTION

This invention describes the feasibility of using the wireless power transfer medium to send messages from a charging device to the source. Wireless power transfer (also referred to as wireless charging) is when energy is transferred from a Source to a Load without a physical connection. A typical example in this case would be a pad that's sits on a flat surface acting as the Source and a mobile phone placed on or near the pad acting as the Load.

Figure 1:
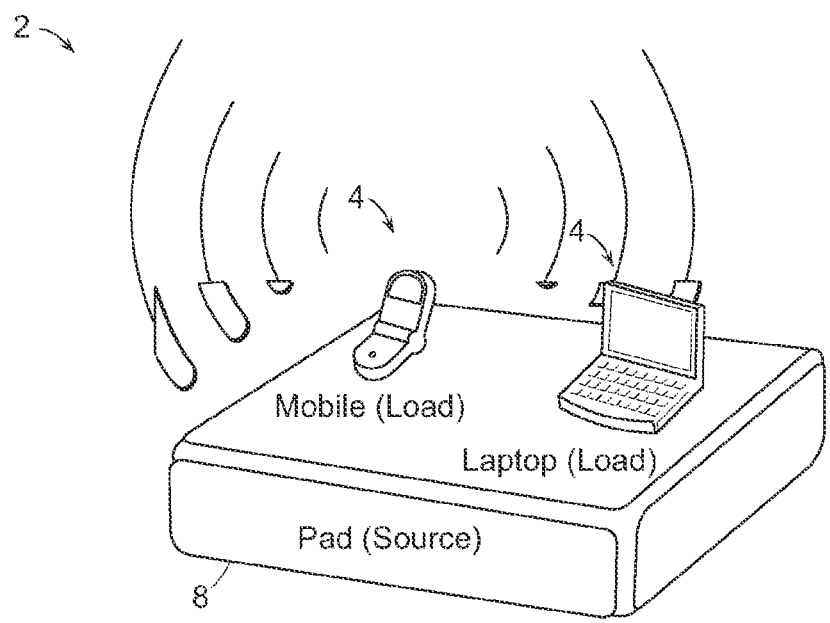
FIG. 1 is a schematic diagram illustrating the charger system.

FIG. 1 shows a wireless power transfer system that includes an in-band communication system 2. In-band communication system 2 has the benefit of being a lower cost solution compared to out-of-band solution. In-band communication allows: (1) Foreign object detection; (2) Power matched to load (vs. full TX power); (3) Power allocation per load; (4) Charger status available on phone; and (5) provisioning/billing. Current wireless power transfer (also referred to as wireless charging) on the market (Qi) employs communication system based on a classic serial communication interface with a start/stop bit or indication and little or no protection on the data transmitted. This serial communication is specified by the Wireless Power Consortium (WPC).

Figure 2:
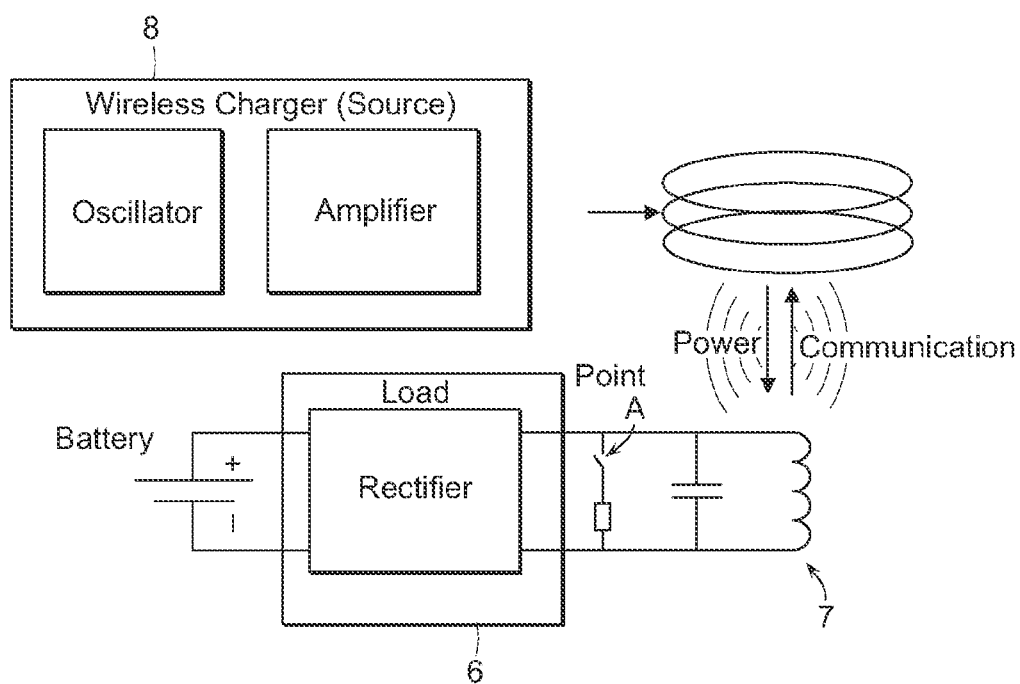
FIG. 2 is a schematic diagram illustrating the impedance variation for Load to Source communications.
Figure 3:
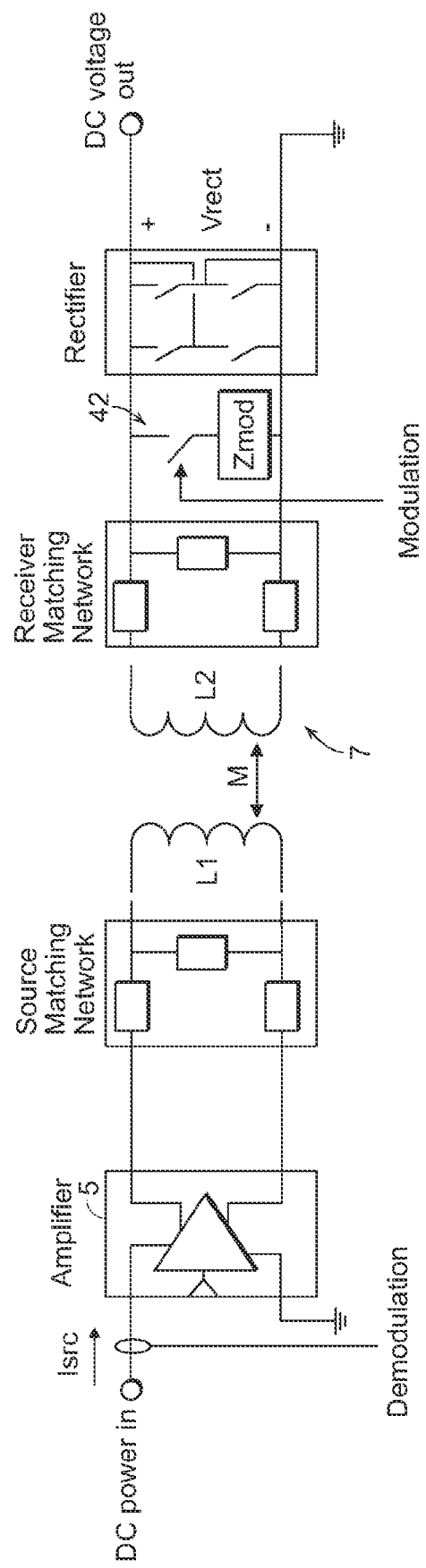
FIG. 3 is a schematic diagram illustrating a wireless power system with load modulation used in accordance with the invention.

The inventive wireless power transfer in-band communication system is different from systems currently on the market or proposed by other companies. In this topology the Load device 4 is required to communicate with the Source 8 to provide power control commands, status and foreign object detection information. It is possible by varying the reflected impedance of the Load 4 seen by the Source 8 to modulate a signal on the transmitted power waveform to facilitate communication between the Load and Source. FIG. 2 shows how the load impedance 6 can be varied (Point A) to modulate the transmitted signal at the Source 8. The modulation component can be either capacitive or resistive. FIG. 3 shows a block diagram representation of load modulation.

Figure 4:
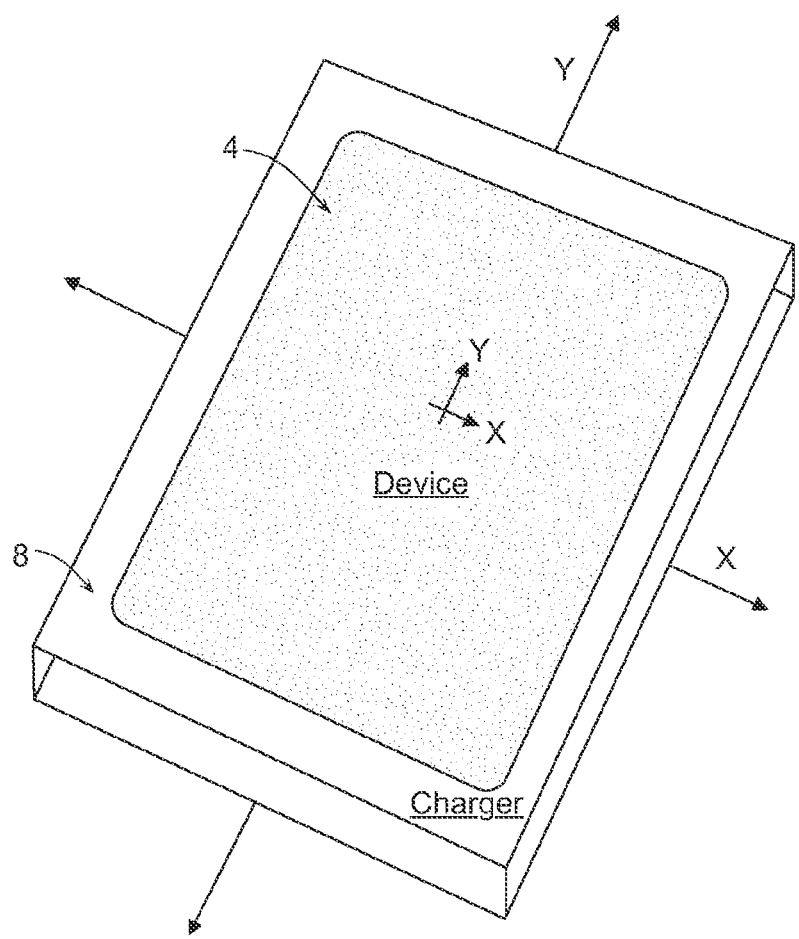
FIG. 4 is a schematic diagram illustrating a charger and device orientation of current available wireless charging topologies.

Note that inductive wireless charging setups require that the device (Load) 4 is sitting flush with the charger (Source) 8, as shown in FIG. 4. For wireless charging to occur the device can only have a limited number of orientations. Both the close proximity and fixed orientation results in very benign wireless charger communication channel conditions—thus allowing a simple communications scheme.

The inventive wireless charging system can utilize a larger form factor to allow multiple devices to charge simultaneously. The inventive wireless charging system can have multiple devices with arbitrary orientation. The devices do not need to be in close proximity or have a fixed orientation. The arbitrary offset and position of the device results in very hostile in-band wireless charger communication channel conditions. This makes communication between Load and Source difficult.

The in-band communication system used by the invention must have low complexity and be robust enough to ensure good communication between the Load(Transmitter) and the Source(Receiver). Complexity is an important factor as both the communication transmission and reception must be able to be implemented on relatively simple MCUs and/or low complexity dedicated hardware.

Figure 5:
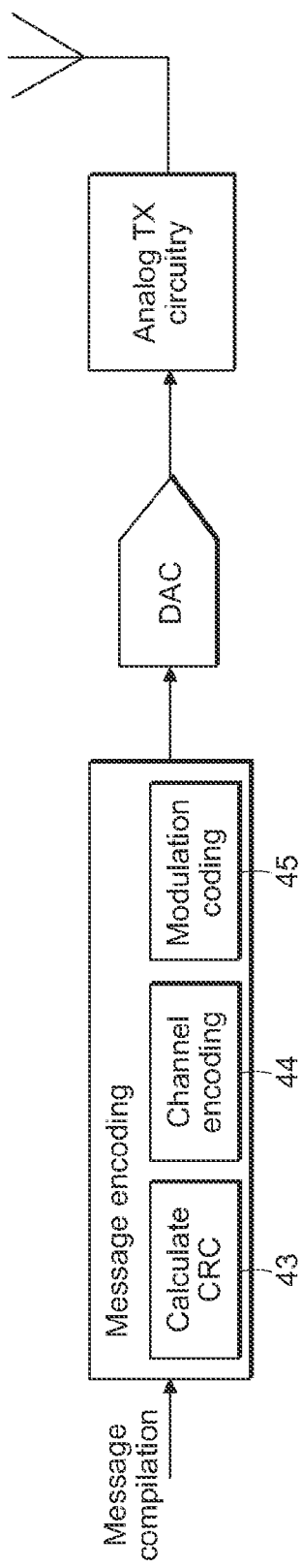
FIG. 5 is a schematic block diagram of the TX communication path used in accordance with the invention.

FIG. 5 shows the transmit portion of the in-band communication system includes: (1) Message formatting; (2) CRC calculation and attachment to message, for message error detection—43; (3) Channel encoding—e.g., BCH error correction encoder—44; (4) Modulation—e.g., biphase modulation for DC balanced signal—45; (5) Prepend message with synchronization sequence—e.g., Golay complementary code; (6) A wireless charging receiver coil used to convert energy in an electromagnetic field to electrical energy—7, as show in FIG. 2 and FIG. 3; (7) Active switching of a passive component—either resistive or capacitive—to change the reflected impedance of the Load seen by the Source—as shown in FIG. 2 as point A, and Zmod 42 of FIG. 3.

Figure 6:
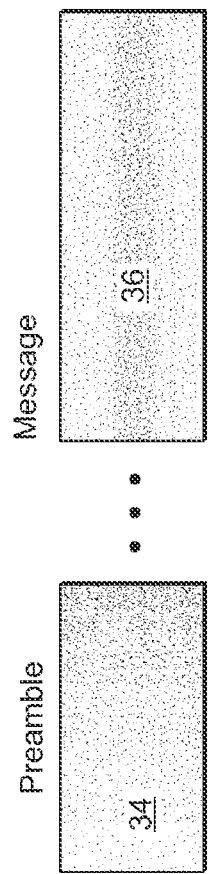
FIG. 6 is a schematic diagram illustrating the preamble/message sequence used in accordance with the invention.
Figure 7:
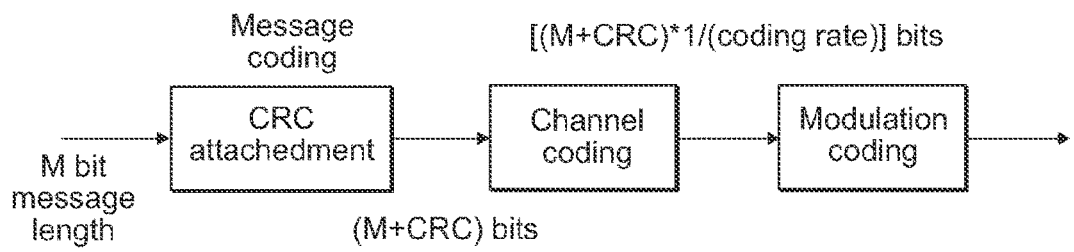
FIG. 7 is a schematic diagram illustrating the transmitter message encoding used in accordance with the invention.

FIG. 6 shows the preamble 34 followed by the message 36 and FIG. 7 shows how the message is constructed before transmitting. Note that a gap between the preamble and message maybe used to allow timing adjustments done by the synchronization block in the receiver to take effect at the output of the digital front end filter in time for the message to be received.

Table 1 shows some typical values for the message encoding/decoding.

TABLE 1

| Message coding element | Size/length |
| --- | --- |
| M message length | ~8-200 bits |
| CRC | 8 bits |
| Channel coding rate | BCH (15, 7) or Hamming (13, 8) |
| Modulation coding | Biphase modulation rate = 4 kHz |

The CRC is used to determine if the message is received without errors. The CRC shall be attached to each message header—if used—and message body. Note that for a variable length communications system the header must indicate the length of the message and must also have a CRC attached to allow for the determination of correct detection. An eight bit CRC could be used with the following polynomial: $poly(D)=D^8+D^7+D^4+D^3+D+1$.

Two error correcting codes have been considered for the wireless charger application but the invention can use other known coding technologies. The first code is a (15,7) double-error-correcting BCH code and the second code is an enhanced (13,8) Hamming code which can correct single-bit errors as well as adjacent double-bit errors. For both codes, an implementation of the encoder and the straightforward implementation of the decoder based on lookup tables is used.

The following describes a possible encoder implementation of a (15,7) double-error-correcting BCH Code. A codeword can be written as $c=(c_1, c_2, \ldots, c_{15})$, where $c_1, c_2, \ldots, c_7$ are information bits and $c_8, c_9, \ldots, c_{15}$ are redundant bits. The parity check matrix of the code is $$H = \begin{bmatrix} 1 & 1 & 0 & 1 & 0 & 0 & 0 & 1 & 0 & 0 & 0 & 0 & 0 & 0 & 0 \\ 0 & 1 & 1 & 0 & 1 & 0 & 0 & 0 & 1 & 0 & 0 & 0 & 0 & 0 & 0 \\ 0 & 0 & 1 & 1 & 0 & 1 & 0 & 0 & 0 & 1 & 0 & 0 & 0 & 0 & 0 \\ 0 & 0 & 0 & 1 & 1 & 0 & 1 & 0 & 0 & 0 & 1 & 0 & 0 & 0 & 0 \\ 1 & 1 & 0 & 1 & 1 & 1 & 0 & 0 & 0 & 0 & 0 & 1 & 0 & 0 & 0 \\ 0 & 1 & 1 & 0 & 1 & 1 & 1 & 0 & 0 & 0 & 0 & 0 & 1 & 0 & 0 \\ 1 & 1 & 1 & 0 & 0 & 1 & 1 & 0 & 0 & 0 & 0 & 0 & 0 & 1 & 0 \\ 1 & 0 & 1 & 0 & 0 & 0 & 1 & 0 & 0 & 0 & 0 & 0 & 0 & 0 & 1 \end{bmatrix}$$

The generator matrix of the code is $$G = \begin{bmatrix} 1 & 0 & 0 & 0 & 0 & 0 & 0 & 1 & 0 & 0 & 0 & 1 & 0 & 1 & 1 \\ 0 & 1 & 0 & 0 & 0 & 0 & 0 & 1 & 1 & 0 & 0 & 1 & 1 & 1 & 0 \\ 0 & 0 & 1 & 0 & 0 & 0 & 0 & 0 & 1 & 1 & 0 & 0 & 1 & 1 & 1 \\ 0 & 0 & 0 & 1 & 0 & 0 & 0 & 1 & 0 & 1 & 1 & 1 & 0 & 0 & 0 \\ 0 & 0 & 0 & 0 & 1 & 0 & 0 & 0 & 1 & 0 & 1 & 1 & 1 & 0 & 0 \\ 0 & 0 & 0 & 0 & 0 & 1 & 0 & 0 & 0 & 1 & 0 & 1 & 1 & 1 & 0 \\ 0 & 0 & 0 & 0 & 0 & 0 & 1 & 0 & 0 & 0 & 1 & 0 & 1 & 1 & 1 \end{bmatrix}$$

The code can correct any double-bit errors. To simplify the error correcting algorithm, the error will be corrected only if the information bits of the codes are affected.

Given 7 information bits v, for encoding the 15-bit codeword can be computed by a modulo 2 matrix multiplication $c=vG$. The formulas for the 8 redundant bits are as follows, where + is the modulo 2 addition.

$$c_8=c_1+c_2+c_4$$

$$c_9=c_2+c_3+c_5$$

$$c_{10}=c_3+c_4+c_6$$

$$c_{11}=c_4+c_5+c_7$$

$$c_{12}=c_1+c_2+c_4+c_5+c_6$$

$$c_{13}=c_2+c_3+c_5+c_6+c_7$$

$$c_{14}=c_1+c_2+c_3+c_6+c_7$$

$$c_{15}=c_1+c_3+c_7$$

The following describes a possible encoder implementation of a (13,8) Enhanced Hamming code. The (13,8) Enhanced Hamming code can correct any single-bit errors and any adjacent double-bit errors. The total number of correctable error patterns is 26. For channel models where almost all of the double-bit errors occur to two adjacent bits, the code can provide nearly as good performance as a double-error-correcting BCH codes.

Given 8 information bits v, the 13-bit codeword can be computed by a modulo 2 matrix multiplication $c=vG$. The formulas for the 5 redundant bits are as follows, where + is the modulo 2 addition.

$$c_9=c_2+c_3+c_5+c_7$$

$$c_{10}=c_1+c_3+c_4+c_6$$

$$c_{11}=c_1+c_2+c_5+c_8$$

$$c_{12}=c_1+c_2+c_3+c_5+c_6$$

$$c_{13}=c_2+c_4+c_7+c_8$$

Figure 32:
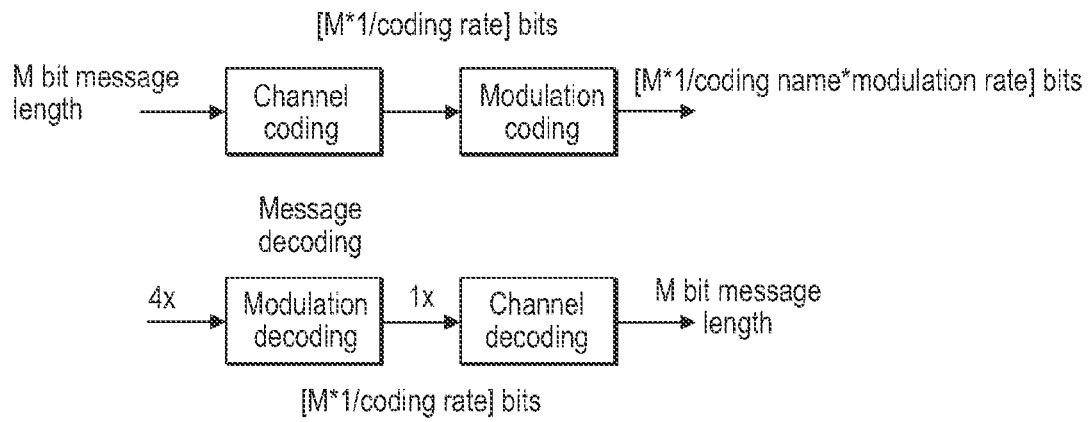
FIG. 32 is a schematic diagram illustrating an inventive receiver design having an alternative channel decoder scheme that does both error correction and detection without the requirement of having a CRC check.

FIG. 32 shows a coding chain that does not require CRC attachment and CRC check. In particular, FIG. 32 is an alternate embodiment of FIG. 7 where a channel coding scheme does both the error correction and error detection so that the CRC code can be removed and the overall message length transmitted can be reduced. If the message length before channel coding is reduce to 16 bits and the channel coder is used both to correct and detect errors then Table 1 becomes that shown in Table 1a. Comparing Table 1 and Table 1a the transmitted message are reduced from 60 to 48 bits while conveying the same amount of un-encoded information—i.e. 16 bits.

TABLE 1A

Fixed length message coding/decoding parameters

| Message coding element | Size/length |
| --- | --- |
| M message length | 16 bits |
| CRC | 0 bits |
| Channel coding rate | RS (48, 16) |
| Transmitted message length for 16 bit input message | 48 bits |
| Modulation coding | Biphase modulation rate = 4 kHz |

The coding scheme used in Table 1a is a Reed-Solomon code—RS (48, 16) code defined over $GF(2^4)$.

Assuming hard-decision decoding is applied, the error detection/correction capability of a given block code is determined by its symbol Hamming distance d. A code with Hamming distance d=2t+1 can:
- Correct up to t-symbol errors
- Or detect up to 2t-symbol errors
- Cannot do both at the same time If one can fully use the error correction capability of a block code with Hamming distance d=2t+1 (up to t errors can be corrected), then an error with Hamming weight d−t=t+1 can be miss corrected as an error of Hamming weight %. Miss corrected errors can be more harmful than undetected errors in channels where errors with smaller multiplicity are more probable (Undetected errors have a multiplicity of at least 2t+1 thus are less probable to occur).

If only t'≤t−1 errors are corrected, then miss corrected errors will have a multiplicity of at least d−t'. By sacrificing its error correction capability (t'<t), we are increasing the error detection capability of the code (d−t' increases as t' decreases). "Multiplicity" of errors is defined as the number of non-zero symbols in the error.

The channel coding setup has a Hamming distance of d=9 which can correct up to 4 symbol errors. If we let t'=3, the code can correct up to 3 symbol errors and at the same time detect all symbol errors with a multiplicity of up to 5. (The multiplicity of miss corrected errors is at least d−t'=6).

Using this scheme to be able to detect errors is dependent on the communications link operating within the specified SNR range. Decoder metrics or an SNR measurement can be used to determine if the communication link is within the specified SNR range and scenarios outside the range constitute message packets that have errors.

Specific consideration has been given to the modulation format. This is important for multiple reasons: to have suitable format for the medium that is dominated by large DC signals, to have good performance in terms of bit-error-rate (BER) and to have format that can be effectively produced by simple circuit realization.

Figure 8:
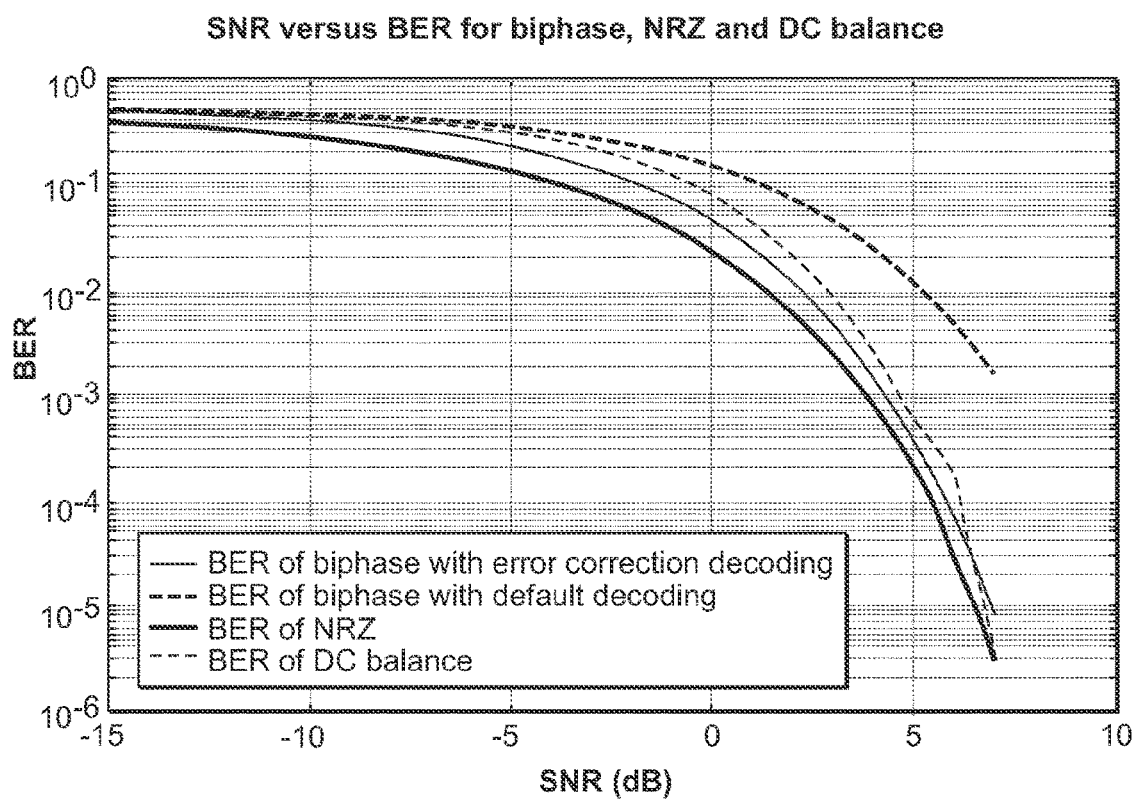
FIG. 8 is a graph illustrating the BER versus SNR for modulation coding methods.

FIG. 8 shows the BER performance of the different methods compared to the Non-Return Zero (NRZ) case with normalized throughput rates. From FIG. 8, it can be seen that the biphase modulation with error correction has slightly better performance than the DC balanced method. However it should be noted that there are a number of consecutive ones (up to 4) in the DC balanced code which is in violation of the number of consecutive "1"s that can be tolerated by the system.

In-band communication is accomplished by means of modulating the impedance of a Load and sensing a power change on the Source. One can detect this power change on the Source via a sensing circuit and provide this as an input to a micro-controller or low complexity hardware block. During communications, a "0" output from the "Load" has no effect on the "Source" coil's impedance. The impedance modulation may have the effect of decreasing the power available to the Load. In order to maintain a relatively constant rate of power transfer the coding scheme should have a relative consistent portion of "1"s and "0"s.

Figures 25, 26:
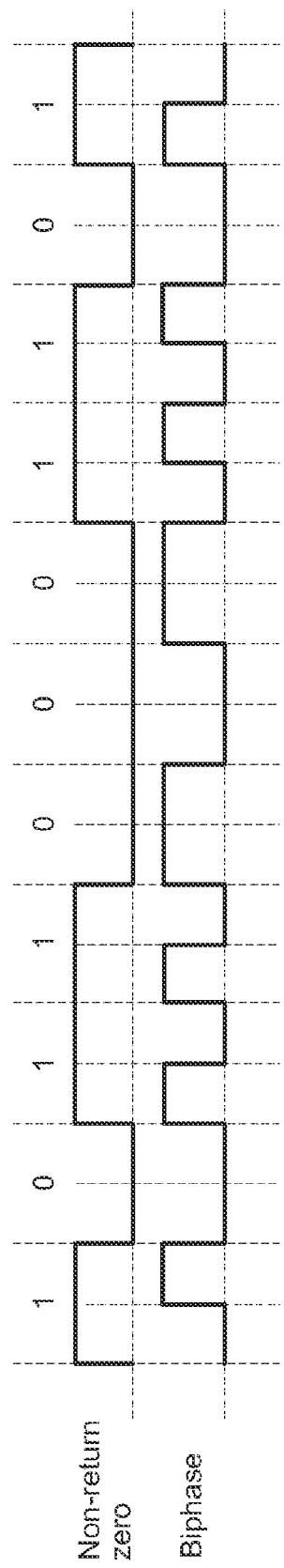
FIG. 25 is a graph illustrating a biphase encoded signal.
FIG. 26 is a table illustrating the maximum likelihood biphase demodulation.

A transmission protocol such as biphase insures that a "1" state will only occur for one bit time before it will be normalized by a "0" state. This type of conditioning is best for the circuitry to minimize the effect on the "receivers" coil voltage. At worst only three consecutive "1"s should occur at the biphase rate (in the example of the system used to illustrate operation rate is 4 kHz). FIG. 25 shows an example of a biphase encoded signal. The signal has a change of level at the boundary of every symbol. A binary "1" has a change of level in the middle of every symbol and a "0" maintains its level for the duration of a symbol.

The receiver portion of the in-band communication system includes: (1) Impedance sensing, to detect changes in the reflected impedance of the Load; (2) Front end filter, used for pulse shaping and noise rejection; (3) Preamble detection block—e.g., Golay complementary code correlator, used for message detection, synchronization, and equalization coefficient estimation; (4) Demodulation and equalization—e.g., biphase demodulation with error correction; (5) Channel decoding—e.g., BCH error correction decoder; (6) CRC calculation, check and removal, for message error detection.

Figure 9:
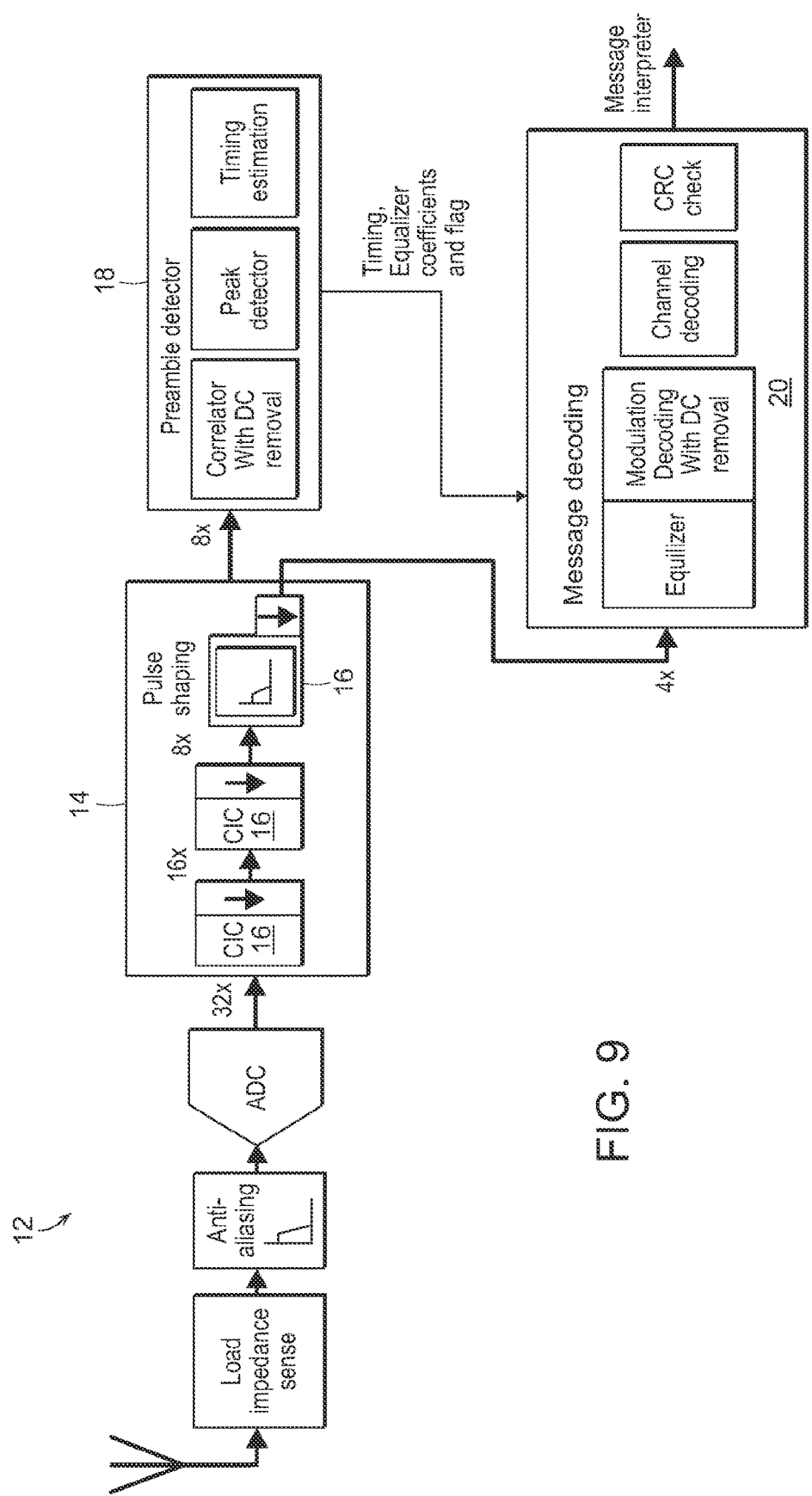
FIG. 9 is a schematic diagram illustrating the RX communication path used in accordance with the invention.
Figure 10:
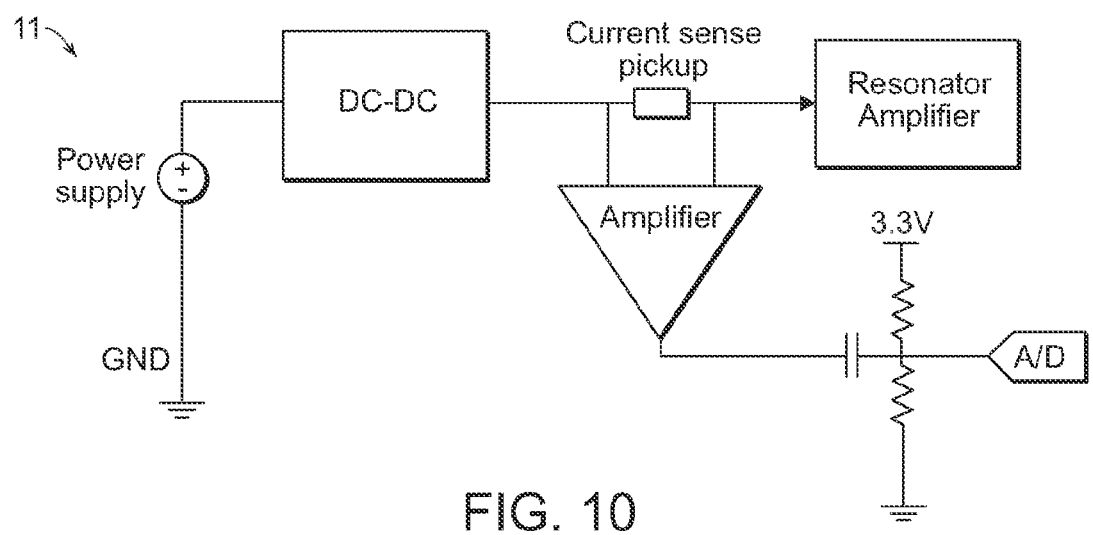
FIG. 10 is a schematic diagram illustrating load impedance sense circuit used in accordance with the invention.

FIG. 9 shows a block diagram of the in-band communications receiver 12. The front end includes load impedance sensing module followed by analog anti-aliasing filter and the analog-to-digital converter (ADC). FIG. 10 shows an exemplary embodiment of a load impedance sense circuit 11 used in accordance circuit. This circuit 11 includes a current sense for load sensing that coupled to an amplifier and resonator amplifier 5, as shown in FIG. 3.

ADC typically operates at the clock rate that is an integer multiple of the data rate supported by in-band communication system. In one of the implementations of the receiver the received signal after ADC is 32× oversampled, with x being the supported data rate, and is down sampled digitally. The sample rate of the signal after downsampling is dependent on the signal processing function being used. For preamble detection the rate of oversampling used can be 8× or 4× and for message reception the oversampling rate is 4×. A higher oversample rate used in the preamble detection results in better noise and DC offset estimation.

Figure 11:
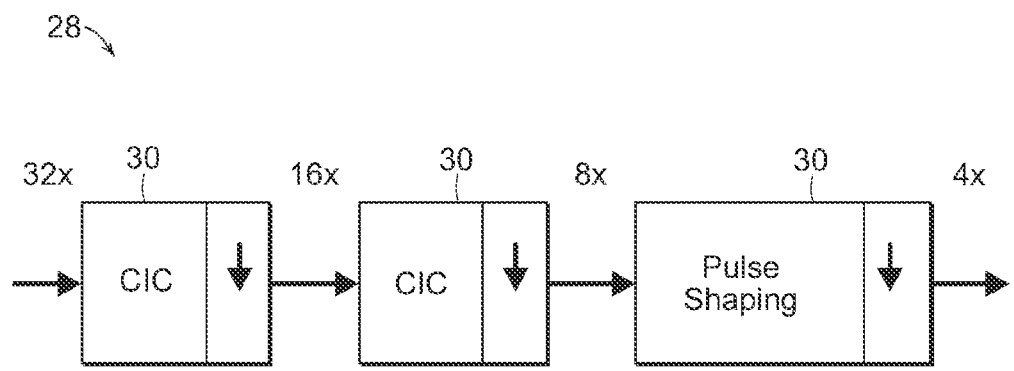
FIG. 11 is a schematic diagram illustrating an example of a cascade of filter sections.

Following ADC is the digital RX front end filter 14 which can be implemented as a cascade of the filter sections 16 to reduce the amount of processing (MIPS) and increase the number of effective bits. The output of the pulse shaping filter is down sampled to the rate required by the preamble and message detection. In the current design the message detection has an input sample rate of 4× rate. The selection of which samples to filter is determined by the synchronization procedure. It should be noted that the pulse shaping filter could be implemented as a cascade of filter sections to reduce the amount of processing (MIPS) required. FIG. 11 shows an example of how the pulse shaping filter 28 could be broken into sections 30.

Figure 12:
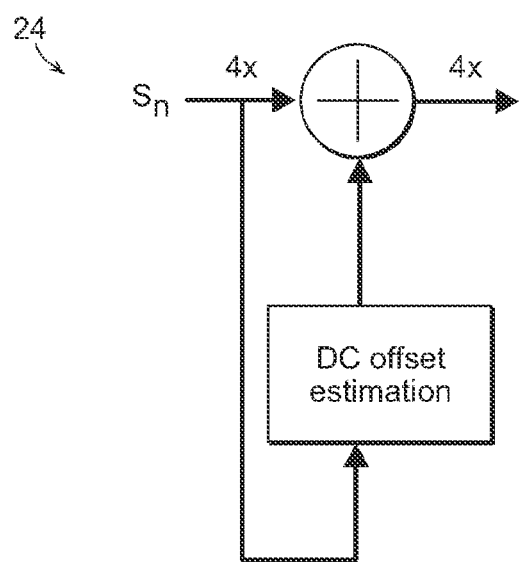
FIG. 12 is a schematic diagram illustrating DC removal block used in accordance with the invention.

The received signal is a combination of wanted biphase modulated signal and unwanted DC offset. The DC offset can be removed within one of the following modules
- Analog front-end
- pulse shaping filter or
- within synchronization and demodulation modules, or at several modules concurrently. It can be done as a separate DC offset removal block 24 shown in FIG. 12. Whether to use a separate DC offset removal or not is a design trade off. For example a course DC offset removal could be done by the analog front end and a fine DC offset done as part of the preamble detector (synchronization) and demodulation block. FIG. 9 shows a block diagram of the front end filters 16 where the DC offset removal is done as part of the preamble detector 18 and the demodulation block 20 using DC block removal block 24, FIG. 12.

Figure 13:
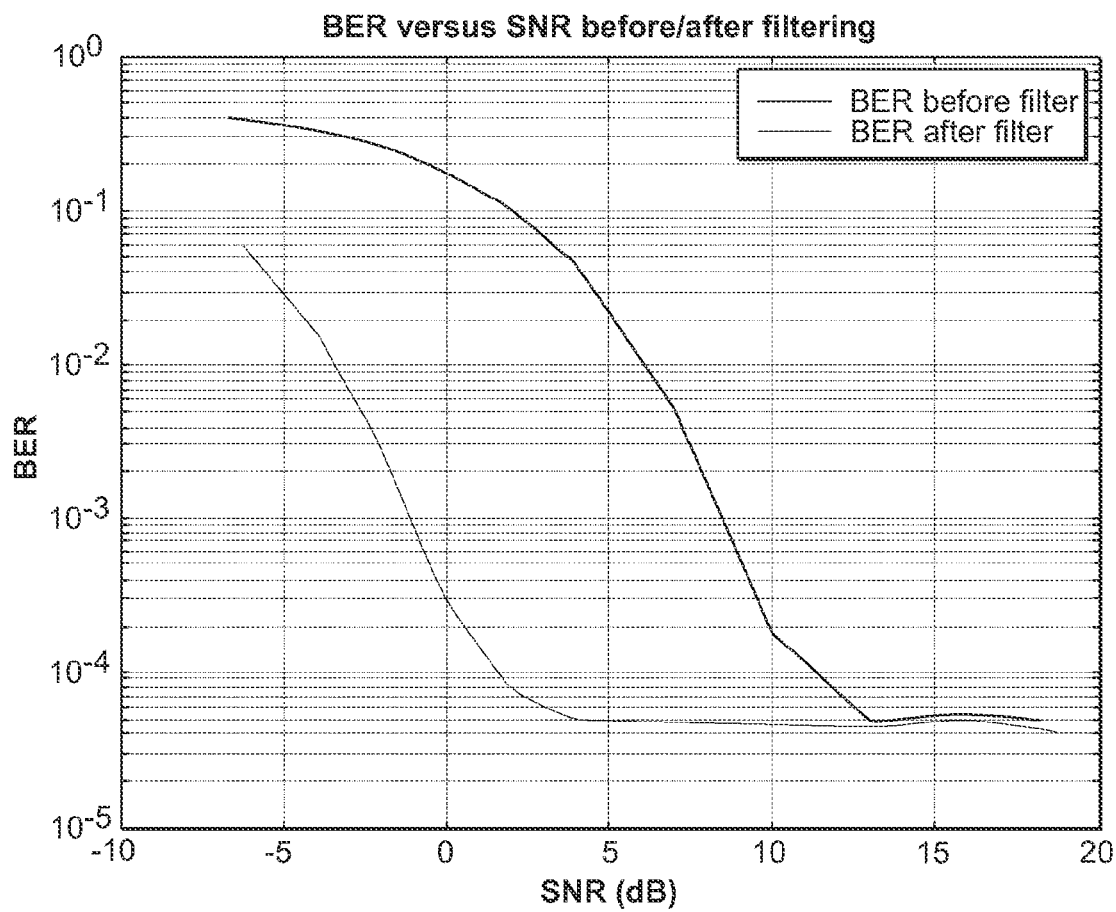
FIG. 13 is a graph illustrating the BER versus SNR for biphase signal before and after pulse shaping filtering with no channel coding.

The following pulse shaping filter was designed to remove the DC offset and attenuate the signal past the first main lobe of the biphase signal. FIG. 13 shows an example of the improvement in the performance when using the pulse shaping filter. FIG. 13 also shows there is a noise floor due to the distortion of the signal within the inband region.

The preamble detector 18 (or syncronization) block contains: (1) Correlator with DC offset; (2) Peak detector; and (3) Timing estimation. The correlator can be done as either a sliding correlator or using the Enhanced Golay Correlator (EGC).

Figure 14:
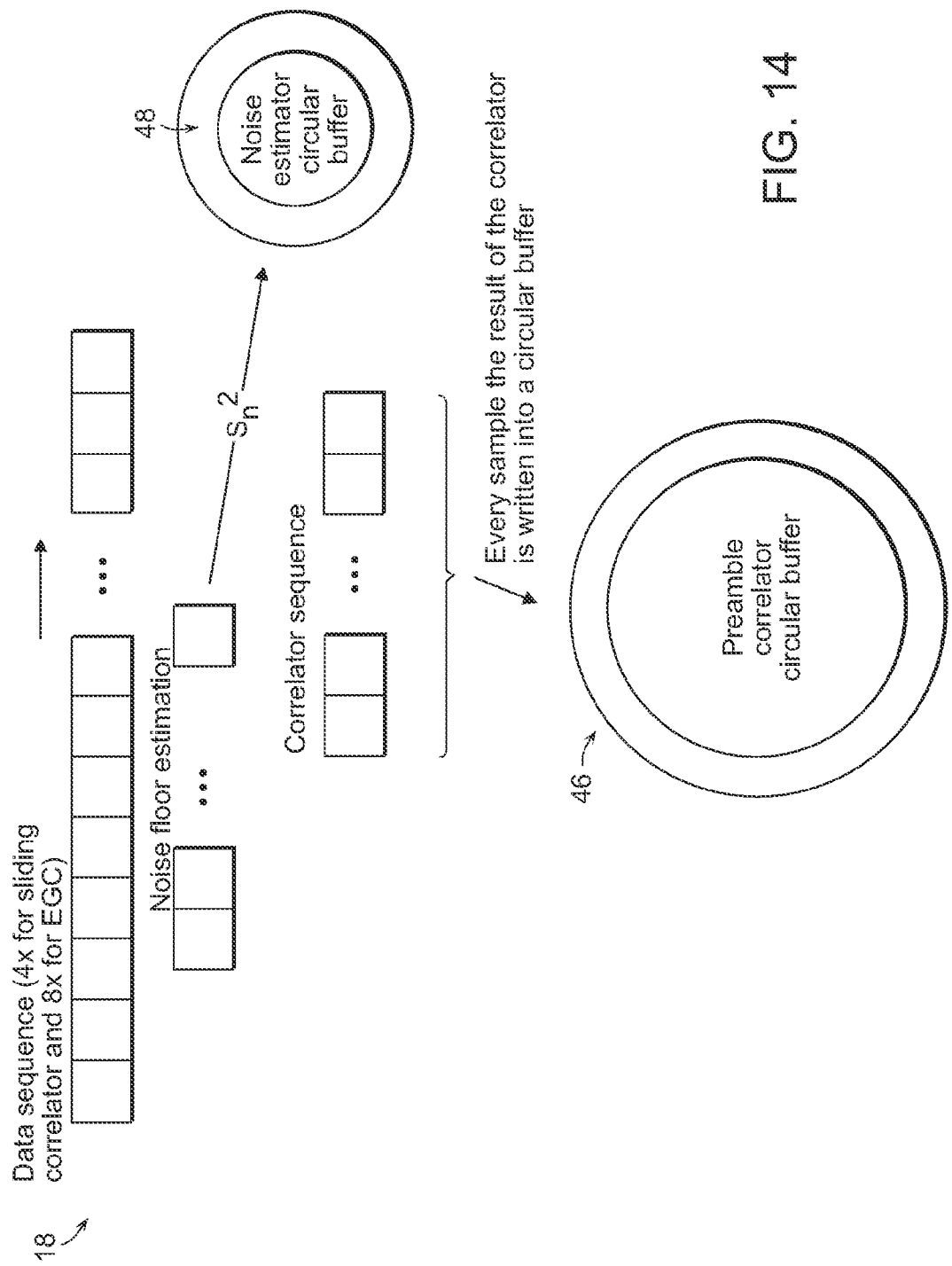
FIG. 14 is a schematic diagram illustrating the preamble correlator operation used in accordance with the invention.
Figure 15:
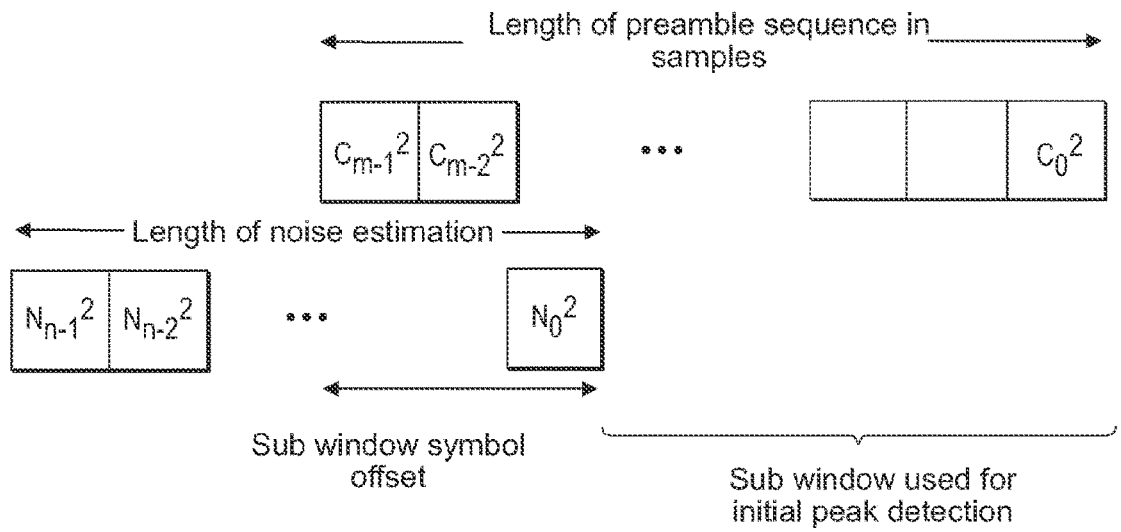
FIG. 15 is a schematic diagram illustrating the preamble peak detector used in accordance with the invention.
Figure 16:
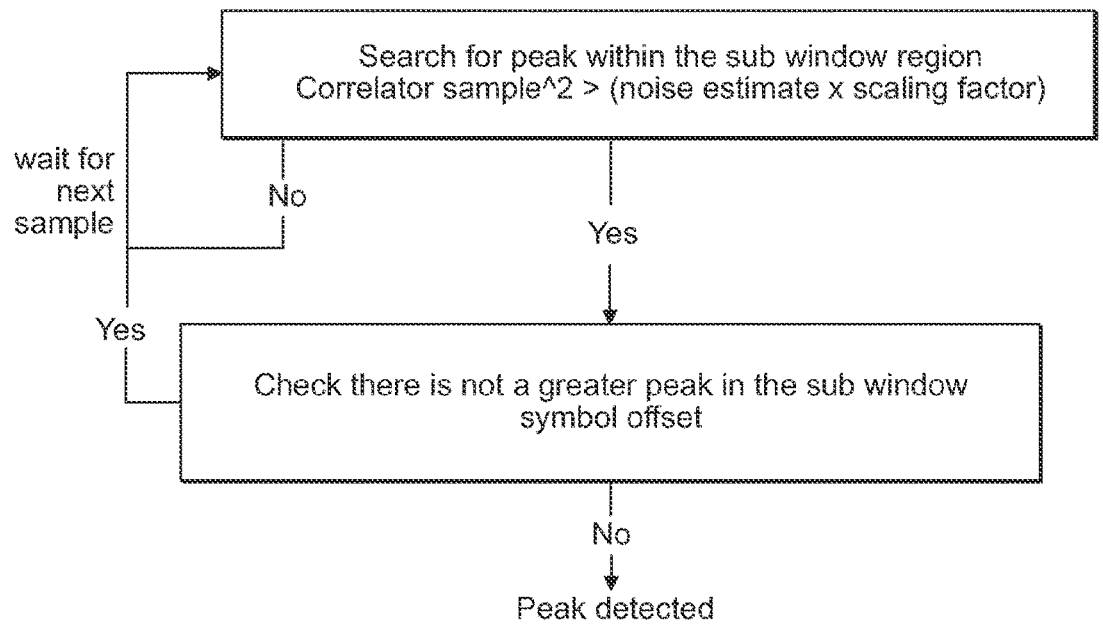
FIG. 16 is a flow chart illustrating exemplary peak detection algorithm used in accordance with the invention.

FIG. 14 shows a block diagram of the preamble correlator operating on the input data sequence. Every sample the correlator outputs a result and loads it into a circulator buffer 46 or a noise estimator circular buffer 48. FIG. 15 shows a diagram with the correlator 46 and noise circular buffer 48 in a linear topology. Note that the noise estimation is a moving average filter which should be set to at least the length of the correlator sequence m. Using a power of two will simplify the code implementation and negate the use of a divide operation. The samples used for the noise estimation $[N_0^2 \ldots N_{n-1}^2]$ should be taken before the sub window used for initial peak detection. FIG. 16 shows the flow chart of one possible implementation used to perform the peak detection.

In order for the Source(Receiver) to determine if the Load(Transmitter) is transmitting a message there needs to be an initial preamble for the Source to do the following: (1) Recognize there is going to be a message transmitted from the Load to the Source; (2) Synchronization of the symbol timing between the Load and the Source by setting which samples are feed into the pulse shaping filter; and (3) Calculation of equalizer coefficients and hence dispersiveness of the channel.

The Load system will have its frequency locked to the Source 6.78 MHz oscillator so the preamble synchronization sequence is only meant for the Source to determine the symbol timing.

FIG. 6 shows an example of a preamble/message sequence. Each message 36 should be accompanied with a preamble sequence 34. The preamble sequence 34 should have the following characteristics: (1) Short length; and (2) Good auto correlation characteristics.

The following codes were investigated: (1) Barker sequence; (2) Complementary Hadamard sequence, (3) length 32; M-sequence length, 32; (4) Complementary Golay sequence, length 16. Note other codes can also be used in accordance with the invention.

Of these synchronization codes investigated the Complementary Golay sequence had good characteristics and also the option of implementing the correlator using the Enhanced Golay Correlator (EGC) or a variant of this method. The EGC and variants are an efficient implementation of a circular correlator and can efficiently support DC offset estimation and removal. The synchronization can be done either using a sliding window time correlator or a circular correlator performed each sample.

It is important to be able to detect the preamble at SNR values that are lower than that expected for a reliable message decoding. From the current requirements with a modulation depth of 0.1 the lowest SNR value encountered is ~0 dB. It is expected that the preamble detection and synchronization can work at <0 dB SNR value.

Figures 17, 18:
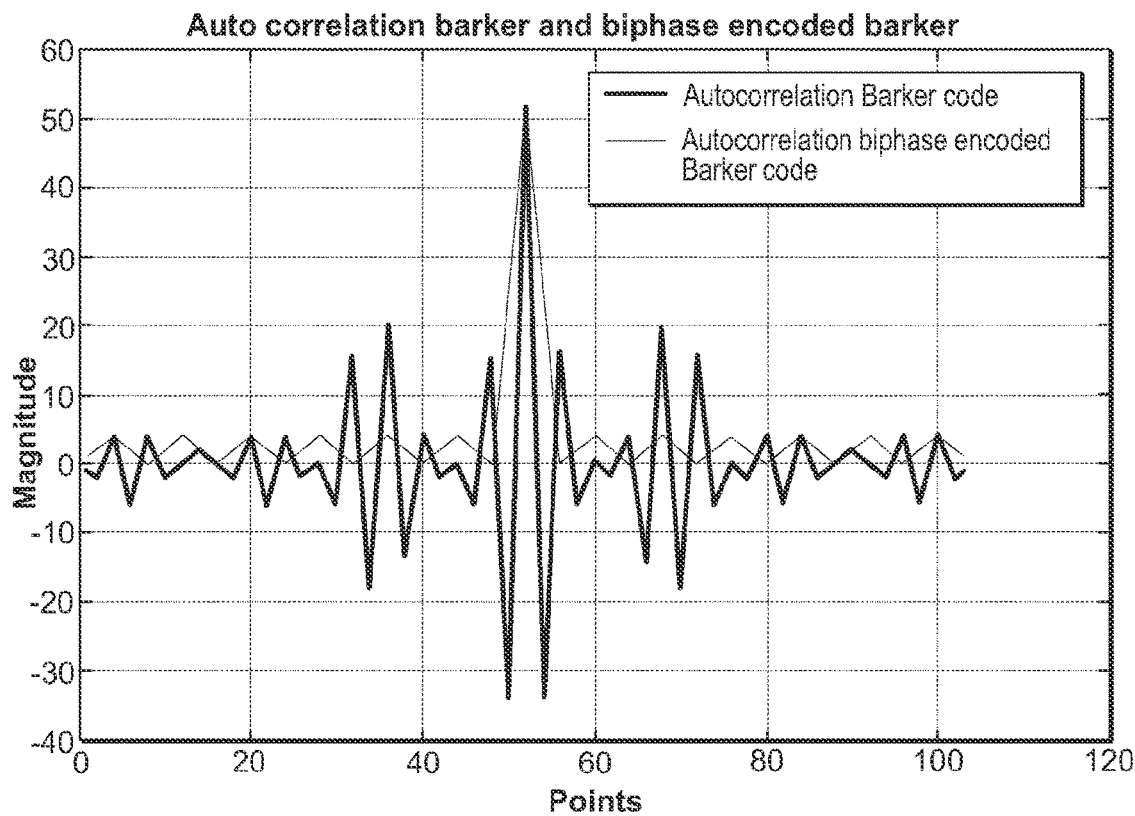
FIG. 17 is a graph illustrating the autocorrelation of Barker and biphase encoded Barker sequence.
FIG. 18 is to able illustrating a 13 bit Barker code and its inverted version.

Biphase encoding a signal with good autocorrelation characteristics will make the autocorrelation characteristics poorer. FIG. 17 shows the characteristics of the 13 bit Barker sequence with and without biphase encoding. As can be seen from FIG. 17, it would be desirable to avoid using biphase encoding for the preamble sequence. FIG. 18 shows the 13 bit Barker code and its inverted version. Having the requirement that the number of consecutive "1"s per half bit is less than or equal to three then the inverted version of the Barker's code can be used directly without additional biphase encoding. Note that this means the Barker code will operate at 4 kHz which is twice the bit rate of the message (2 kHz). The performance of the Barker code shown meets requirements for the AWGN case.

Figures 19, 20:
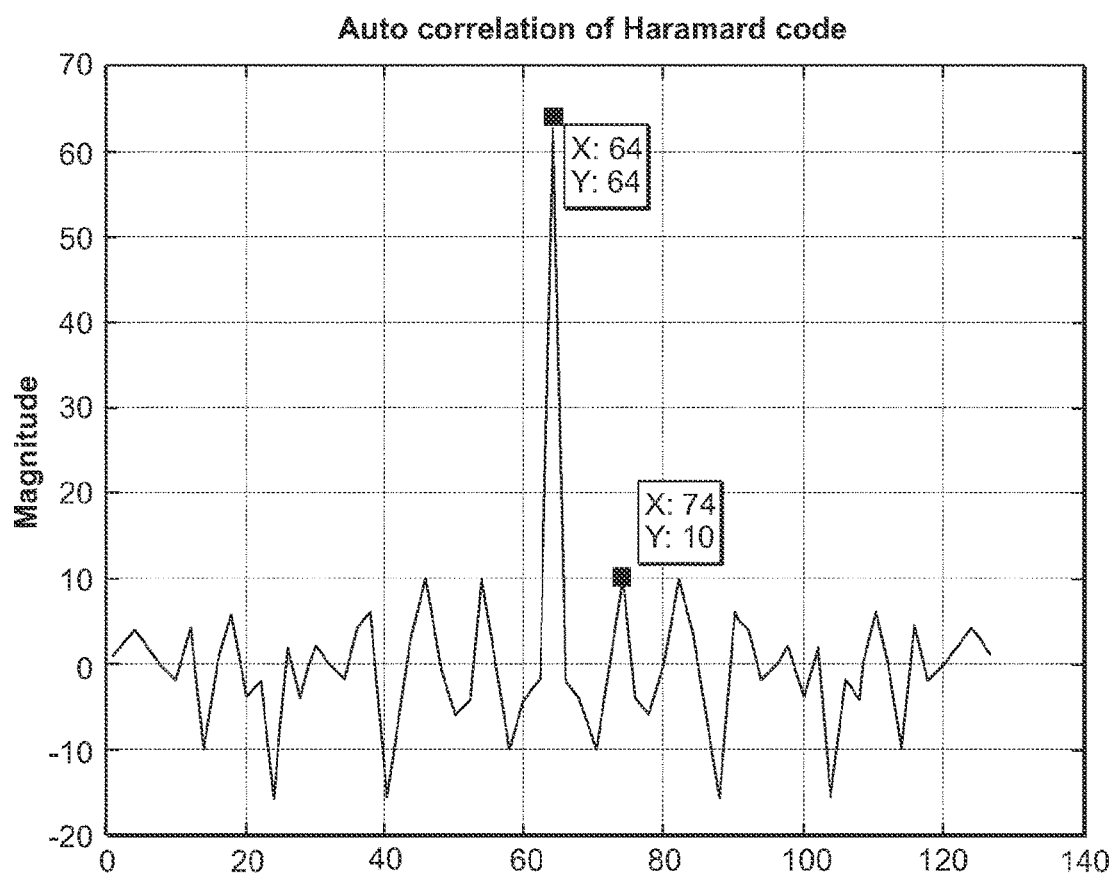
FIG. 19 is a graph illustrating the autocorrelation of Hadamard sequence.
FIG. 20 is a table illustrating the 2×8 bit Golay complementary sequence.

The autocorrelation properties of several M-sequences and complementary Hadamard sequences of length 32 were also investigated and it was found that the Hadamard sequences had good auto correlation properties. The auto correlation of the Hadamard sequence is shown in FIG. 19. Even though the ratio of the peak to side lobe of the Hadamard autocorrelation is less than the Barker code the additional length of the Hadamard allows more averaging.

Figure 21:
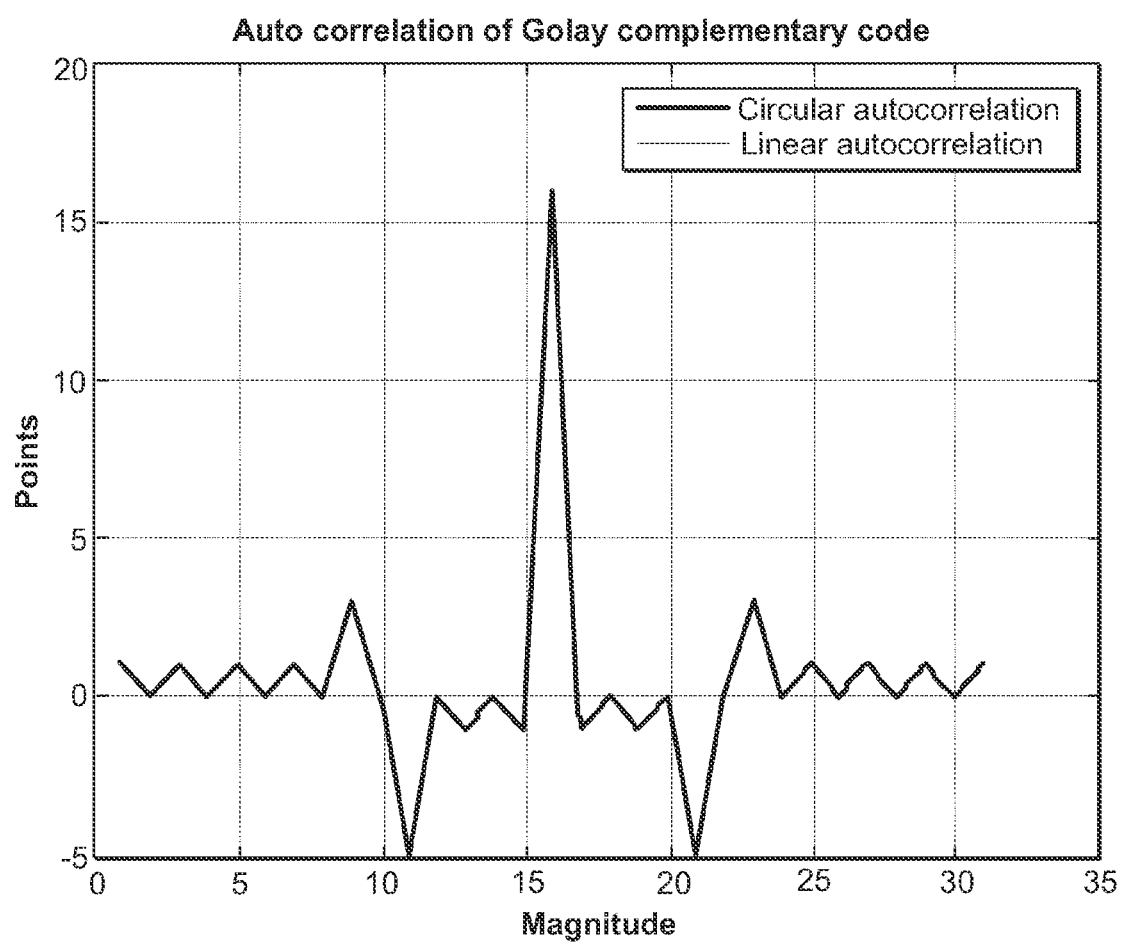
FIG. 21 is a graph illustrating the autocorrelation of Golay complementary sequence.

Golay complementary sequences have good autocorrelation characteristics. FIG. 20 shows a 2×8 Golay complementary sequence. FIG. 21 shows the auto-correlation of the Golay complementary sequence.

Figure 22A:
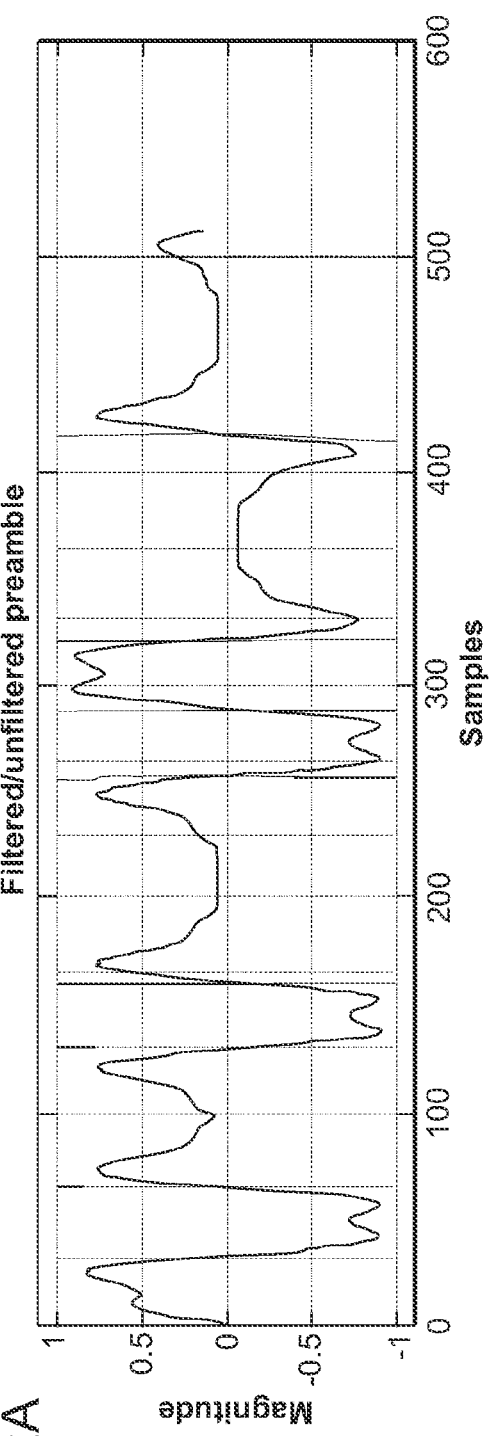
FIGS. 22A-22B are graphs illustrating the output waveforms after pulse shaping filtering including DC offset removal.
Figure 22B:
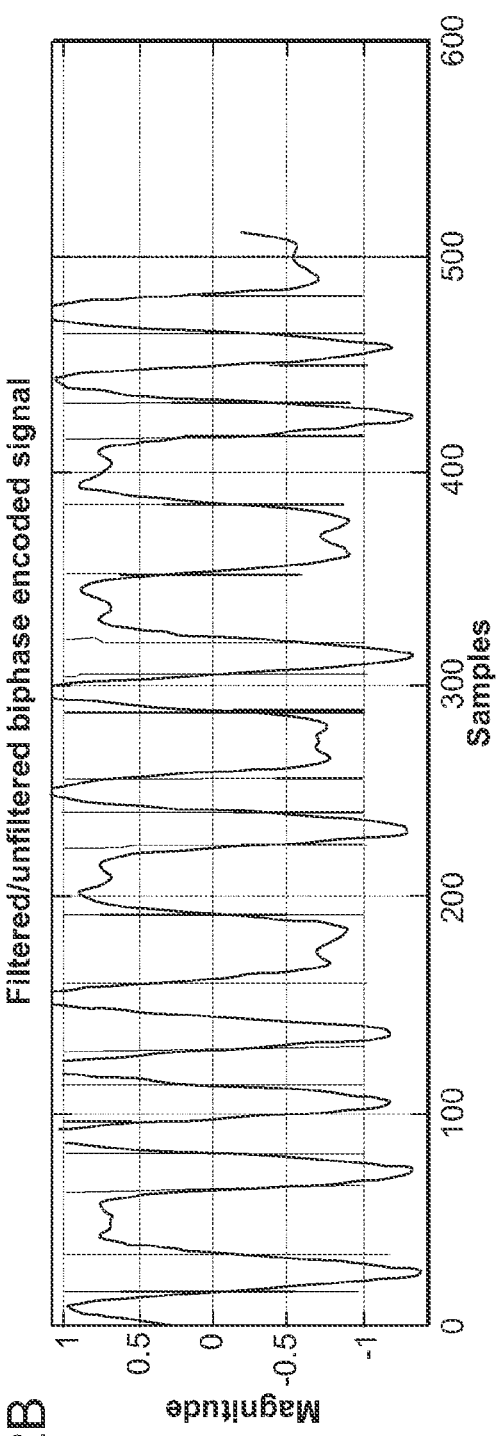
Figure 23:
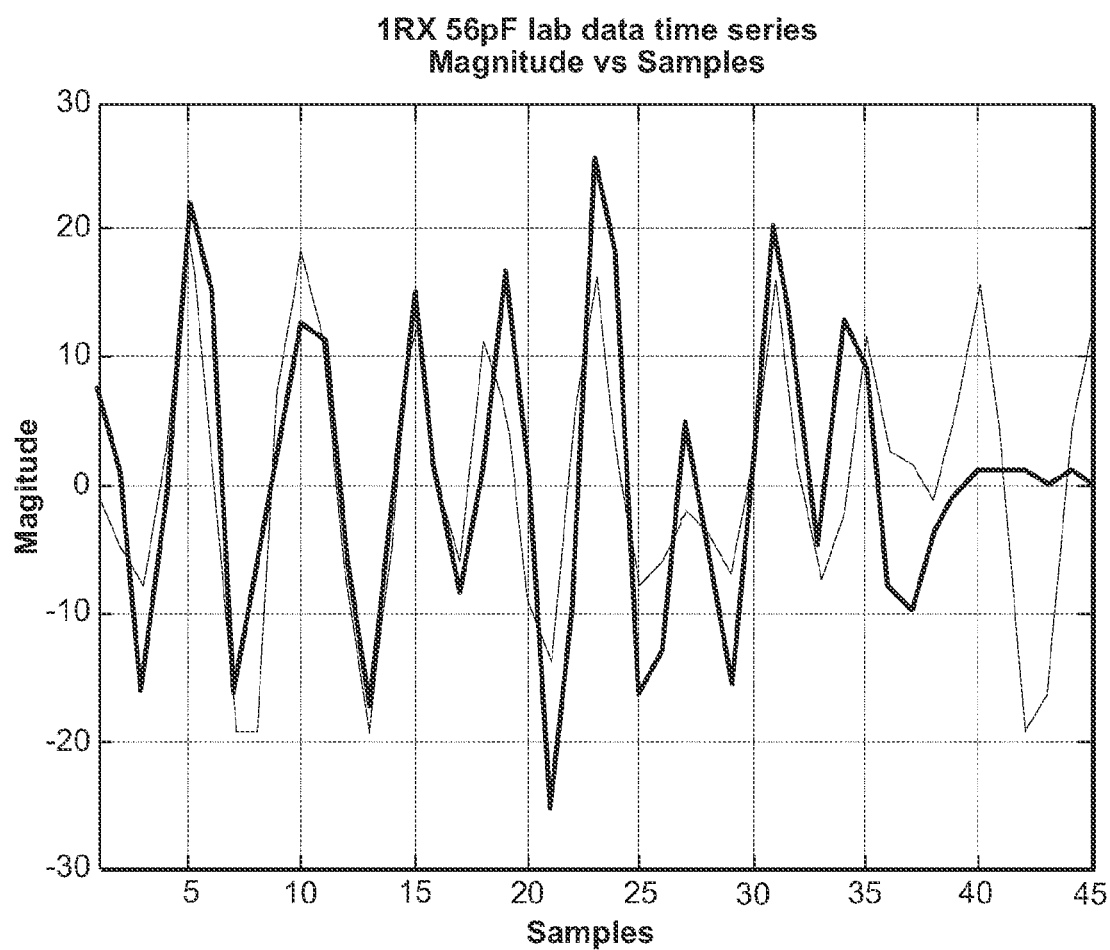
FIG. 23 is a graph illustrating the captured Golay complementary sequence after pulse shaping filtering including DC offset removal.

FIG. 22A shows the Golay complementary sequence and a random biphase signal after pulse shaping filtering with DC offset removal. A can be seen in FIG. 22B, part of the wanted signal of the preamble is removed by the pulse shaping filter with DC offset removal. The synchronization procedure is robust but in conditions where the modulation depth of the signal is low then this method of DC offset removal may not be acceptable. FIG. 23 shows two preamble signals captured in the laboratory. Both preamble signals are distorted which reduces the probability of detection. For this reason it was decided to use the moving average DC offset removal.

Figure 24:
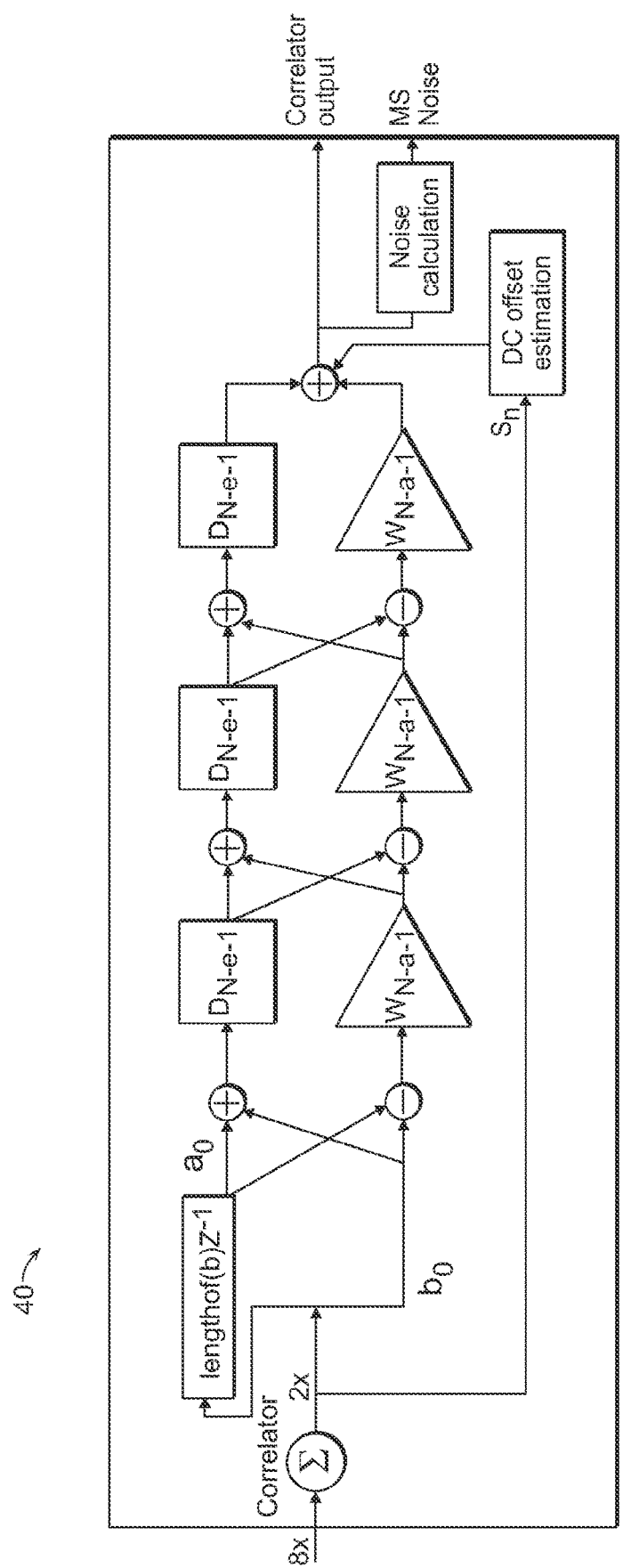
FIG. 24 is schematic diagram illustrating the preamble detector correlator.

To minimize the amount of processing required by the preamble detector the correlator 40 has been implemented as an Optimized Golay Correlator (OGC) with the noise estimation and DC offset estimation and removal built into the correlator block 40, as shown in FIG. 24. As shown in FIG. 24, the correlator block has the following relationships:

$$a'_0[k] = a[k] \quad \text{Eq. 1}$$

$$b'_0[k] = b[k] \quad \text{Eq. 2}$$

$$a'_n[k] = a'_{n-1}[k - D_{N-n-1}] + b'_{n-1}[k - D_{N-n-1}] \quad \text{Eq. 3}$$

$$a'_n[k] = W_{N-n-1}(a'_{n-1}[k - D_{N-n-1}] - b'_{n-1}[k - D_{N-n-1}]) \quad \text{Eq. 4}$$

$$a'_N[k] + b'_N[k] \quad \text{Eq. 5}$$

$$Y[k] = a'_N[k] + b'_N[k] \quad \text{Eq. 6}$$

$$\text{MS Noise} = \frac{1}{L}\sum_{l=0}^{L-1} Y[l]^2 \quad \text{Eq. 7}$$

where N=3, n=0, 1, 2, k=0, . . . , 7, L=7, a[k] and b[k] are the received signals, a'$_i$[k] and b'$_i$[k] are partial results, Y[k] is the correlation between the input signal and the Golay sequence, Y[7] is the correlator output, MS Noise is the mean square of the noise for the current correlator output.

The DC offset is calculated using the equation below:

$$\text{DC offset} = \frac{1}{N}\sum_{n=0}^{N-1} S_n \quad \text{Eq. 8}$$

where N is the number of samples in the preamble sequence.

After a peak is detected the timing alignment needs to be determined so that this can be feedback to the pulse shaping filter to adjust the input samples to give the best timing alignment. The timing alignment of the received signal can be obtained by using an interpolation filter on the down sampled correlation data used for the preamble detection.

Due to the interpolation the data must be padded with zeros. Only five correlation values are required around the correlation peak (zn).

$$Z_m = (z_{n-2}, 0, 0, 0, z_{n-1}, 0, 0, 0, z_n, 0, 0, 0, z_{n+1}, 0, 0, 0, z_{n+2}, 0, 0, 0).$$

The output of the interpolator and the data gives:

$$B(k) = b_0 + b_1 + \ldots + b_k,$$

where $k = m+n-1$

The location of the peak detected in the previous operation in the interpolated data set is at $b_{15}$. A search can be done around sample $b_{15}$ of +/−3 samples to determine if there is a greater value.

To simplify the interpolation procedure the interpolation filter's tapped delay line can be pre-loaded and only seven operations of the interpolation filter is required. A more efficient implementation would be to avoid a filter structure and use seven dedicated operations. Table 2 shows simplified interpolation filtering and Table 3 shows the dedicated sub-operations for interpolations filtering.

TABLE 2

| Interpolations Coefficients | Tapped delay lines | | | | | | |
|---|---|---|---|---|---|---|---|
| −2 | 0 | 0 | $Z_{n-2}$ | 0 | 0 | 0 | $Z_{n-1}$ |
| −3 | 0 | $Z_{n-2}$ | 0 | 0 | 0 | $Z_{n-1}$ | 0 |
| −2 | $Z_{n-2}$ | 0 | 0 | 0 | $Z_{n-1}$ | 0 | 0 |
| 0 | 0 | 0 | 0 | $Z_{n-1}$ | 0 | 0 | 0 |
| 9 | 0 | 0 | $Z_{n-1}$ | 0 | 0 | 0 | $z_n$ |
| 18 | 0 | $Z_{n-1}$ | 0 | 0 | 0 | $z_n$ | 0 |
| 26 | $Z_{n-1}$ | 0 | 0 | 0 | $z_n$ | 0 | 0 |
| 31 | 0 | 0 | 0 | $z_n$ | 0 | 0 | 0 |
| 26 | 0 | 0 | $z_n$ | 0 | 0 | 0 | $Z_{n+1}$ |
| 18 | 0 | $z_n$ | 0 | 0 | 0 | $Z_{n+1}$ | 0 |
| 9 | $z_n$ | 0 | 0 | 0 | $Z_{n+1}$ | 0 | 0 |
| 0 | 0 | 0 | 0 | $Z_{n+1}$ | 0 | 0 | 0 |
| −2 | 0 | 0 | $Z_{n+1}$ | 0 | 0 | 0 | $Z_{n+2}$ |
| −3 | 0 | $Z_{n+1}$ | 0 | 0 | 0 | $Z_{n+2}$ | 0 |
| −2 | $Z_{n+1}$ | 0 | 0 | 0 | $Z_{n+2}$ | 0 | 0 |
| Filter output | b12 | b13 | b14 | b15 | b16 | b17 | b18 |

TABLE 3

| Filter output | Operation |
|---|---|
| b12 | −2 * [(Zn − 2) + (Zn + 1)] + 26 * (Zn − 1) + 9 * (Zn) |
| b13 | −3 * [(Zn − 2) + (Zn + 1)] + 18 * [(Zn − 1) + (Zn)] |
| b14 | −2 * [(Zn − 2) + (Zn + 1)] + 9 * (Zn − 1) + 26 * (Zn) |
| b15 | 31 * (Zn) |
| b16 | −2 * [(Zn − 1) + (Zn + 2)] + 26 * (Zn) + 9 * (Zn + 1) |
| b17 | −3 * [(Zn − 1) + (Zn + 2)] + 18 * [(Zn) + (Zn + 1)] |
| b18 | −2 * [(Zn − 1) + (Zn + 2)] + 9 * (Zn) + 26 * (Zn + 1) |

Following the synchronization the receiver performs demodulation by providing the functions of (optional) equalization, modulation decoding, channel decoding of the message and CRC check. If a channel coding scheme is used that does both error correction and detection then the CRC block is not required.

One of the items considered for the use in demodulation part of the receiver is equalizer. Experiments have determined that for the channel with time dispersion using the equalizer can be beneficial and it can be signaled by the flag from synchronization module.

The biphase with error correction method makes use of the soft bits, the characterisitics of biphase encoding and maximum likelihood (ML) correction. Looking at FIG. 25 it can be seen that a biphase encoded signal must change sign at the start of every bit. If the received signal does not change sign at the start of every bit then a comparison of the magnitude of the previous end of bit and the start of the current bit can be used to determine which bit's—end or start—sign is changed. FIG. 26 shows the ML biphase demodulation truth table.

Figure 28:
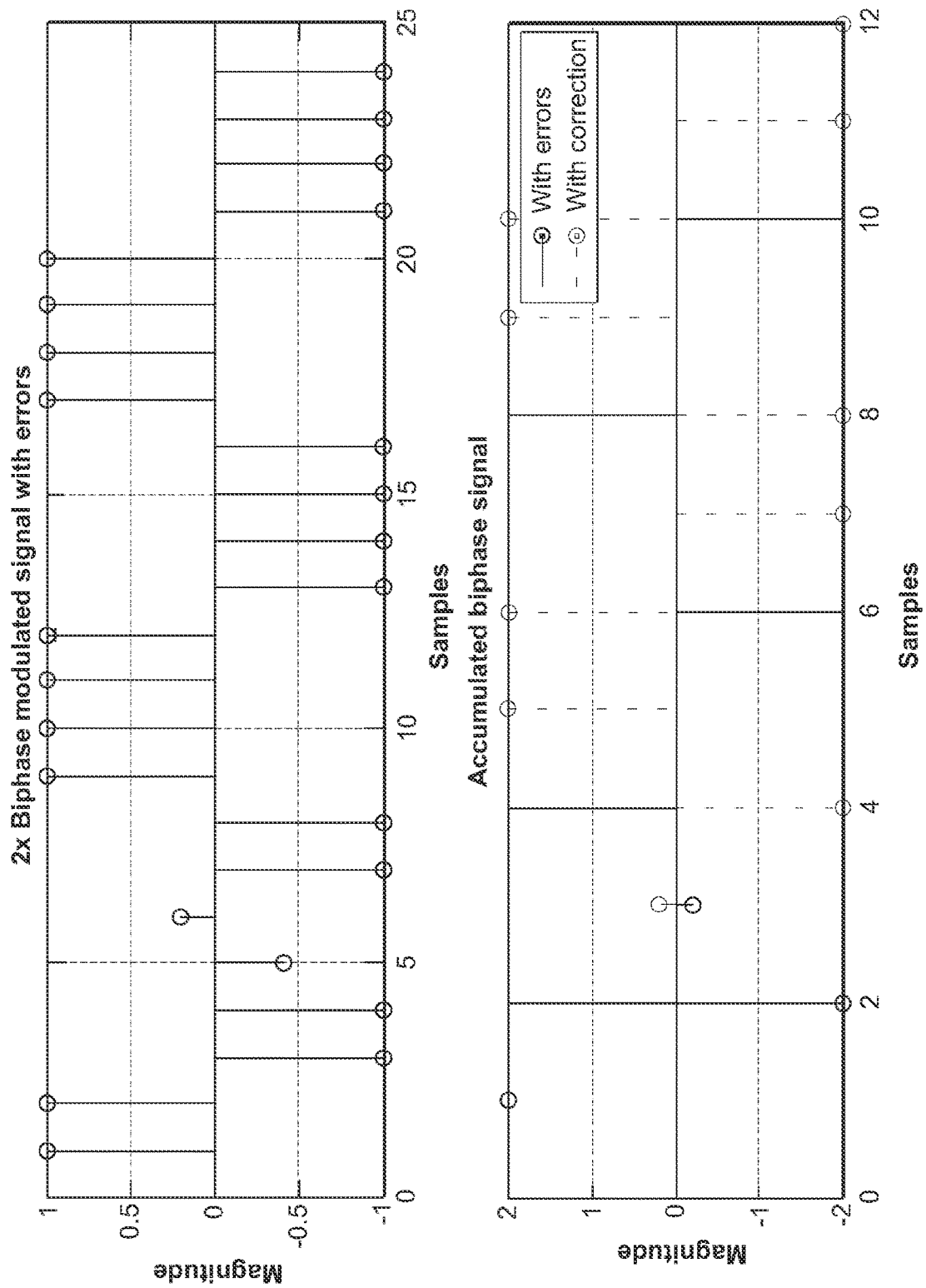
FIG. 28 is a graph illustrating an example of biphase decoding with error correction.

FIG. 27 shows the steps for biphase decoding with error correction. FIG. 28 shows an example of biphase decoding with error correction.

The invention produces BER results using a system configuration with the following: (1) Biphase modulation; (2) pulse shaping filter at the receiver; and (3) Channel coding BCH.

The following describes a possible decoder implementation of a (15,7) double-error-correcting BCH Code. After receiving a possibly distorted codeword $\tilde{c}$, compute the syndrome of the BCH code by a modulo 2 matrix multiplication $s = H\tilde{c}$, where s is an 8-bit binary vector. No error is detected if $s=0$. If $s \neq 0$, the syndrome and its corresponding error vector is shown in Table 3. If a nonzero s is not in Table 3, then the information bits of the codeword is not affected by the error. Table 3 shows the error pattern for different syndromes s for the regular (15,7) BCH Code

TABLE 3

| s (Decimal Value of an 8-Bit Binary Vector) | Error Pattern |
|---|---|
| 209 | 1 0 0 0 0 0 0 0 0 0 0 0 0 0 0 |
| 115 | 0 1 0 0 0 0 0 0 0 0 0 0 0 0 0 |
| 230 | 0 0 1 0 0 0 0 0 0 0 0 0 0 0 0 |
| 29 | 0 0 0 1 0 0 0 0 0 0 0 0 0 0 0 |
| 58 | 0 0 0 0 1 0 0 0 0 0 0 0 0 0 0 |
| 116 | 0 0 0 0 0 1 0 0 0 0 0 0 0 0 0 |
| 232 | 0 0 0 0 0 0 1 0 0 0 0 0 0 0 0 |
| 1 | 0 0 0 0 0 0 0 1 0 0 0 0 0 0 0 |
| 2 | 0 0 0 0 0 0 0 0 1 0 0 0 0 0 0 |
| 4 | 0 0 0 0 0 0 0 0 0 1 0 0 0 0 0 |
| 8 | 0 0 0 0 0 0 0 0 0 0 1 0 0 0 0 |
| 16 | 0 0 0 0 0 0 0 0 0 0 0 1 0 0 0 |
| 32 | 0 0 0 0 0 0 0 0 0 0 0 0 1 0 0 |
| 64 | 0 0 0 0 0 0 0 0 0 0 0 0 0 1 0 |
| 128 | 0 0 0 0 0 0 0 0 0 0 0 0 0 0 1 |
| 208 | 1 0 0 0 0 0 0 1 0 0 0 0 0 0 0 |
| 211 | 1 0 0 0 0 0 0 0 1 0 0 0 0 0 0 |
| 213 | 1 0 0 0 0 0 0 0 0 1 0 0 0 0 0 |
| 217 | 1 0 0 0 0 0 0 0 0 0 1 0 0 0 0 |
| 193 | 1 0 0 0 0 0 0 0 0 0 0 1 0 0 0 |
| 241 | 1 0 0 0 0 0 0 0 0 0 0 0 1 0 0 |
| 145 | 1 0 0 0 0 0 0 0 0 0 0 0 0 1 0 |
| 81 | 1 0 0 0 0 0 0 0 0 0 0 0 0 0 1 |
| 114 | 0 1 0 0 0 0 0 1 0 0 0 0 0 0 0 |
| 113 | 0 1 0 0 0 0 0 0 1 0 0 0 0 0 0 |
| 119 | 0 1 0 0 0 0 0 0 0 1 0 0 0 0 0 |
| 123 | 0 1 0 0 0 0 0 0 0 0 1 0 0 0 0 |
| 99 | 0 1 0 0 0 0 0 0 0 0 0 1 0 0 0 |
| 83 | 0 1 0 0 0 0 0 0 0 0 0 0 1 0 0 |
| 51 | 0 1 0 0 0 0 0 0 0 0 0 0 0 1 0 |
| 243 | 0 1 0 0 0 0 0 0 0 0 0 0 0 0 1 |
| 231 | 0 0 1 0 0 0 0 1 0 0 0 0 0 0 0 |
| 228 | 0 0 1 0 0 0 0 0 1 0 0 0 0 0 0 |
| 226 | 0 0 1 0 0 0 0 0 0 1 0 0 0 0 0 |
| 238 | 0 0 1 0 0 0 0 0 0 0 1 0 0 0 0 |
| 246 | 0 0 1 0 0 0 0 0 0 0 0 1 0 0 0 |
| 198 | 0 0 1 0 0 0 0 0 0 0 0 0 1 0 0 |
| 166 | 0 0 1 0 0 0 0 0 0 0 0 0 0 1 0 |
| 102 | 0 0 1 0 0 0 0 0 0 0 0 0 0 0 1 |
| 28 | 0 0 0 1 0 0 0 1 0 0 0 0 0 0 0 |
| 31 | 0 0 0 1 0 0 0 0 1 0 0 0 0 0 0 |
| 25 | 0 0 0 1 0 0 0 0 0 1 0 0 0 0 0 |
| 21 | 0 0 0 1 0 0 0 0 0 0 1 0 0 0 0 |
| 13 | 0 0 0 1 0 0 0 0 0 0 0 1 0 0 0 |
| 61 | 0 0 0 1 0 0 0 0 0 0 0 0 1 0 0 |
| 93 | 0 0 0 1 0 0 0 0 0 0 0 0 0 1 0 |
| 157 | 0 0 0 1 0 0 0 0 0 0 0 0 0 0 1 |

TABLE 3-continued

| s (Decimal Value of an 8-Bit Binary Vector) | Error Pattern |
|---|---|
| 59 | 0 0 0 0 1 0 0 1 0 0 0 0 0 0 0 |
| 56 | 0 0 0 0 1 0 0 0 1 0 0 0 0 0 0 |
| 62 | 0 0 0 0 1 0 0 0 0 1 0 0 0 0 0 |
| 50 | 0 0 0 0 1 0 0 0 0 0 1 0 0 0 0 |
| 42 | 0 0 0 0 1 0 0 0 0 0 0 1 0 0 0 |
| 26 | 0 0 0 0 1 0 0 0 0 0 0 0 1 0 0 |
| 122 | 0 0 0 0 1 0 0 0 0 0 0 0 0 1 0 |
| 186 | 0 0 0 0 1 0 0 0 0 0 0 0 0 0 1 |
| 117 | 0 0 0 0 0 1 0 1 0 0 0 0 0 0 0 |
| 118 | 0 0 0 0 0 1 0 0 1 0 0 0 0 0 0 |
| 112 | 0 0 0 0 0 1 0 0 0 1 0 0 0 0 0 |
| 124 | 0 0 0 0 0 1 0 0 0 0 1 0 0 0 0 |
| 100 | 0 0 0 0 0 1 0 0 0 0 0 1 0 0 0 |
| 84 | 0 0 0 0 0 1 0 0 0 0 0 0 1 0 0 |
| 52 | 0 0 0 0 0 1 0 0 0 0 0 0 0 1 0 |
| 244 | 0 0 0 0 0 1 0 0 0 0 0 0 0 0 1 |
| 233 | 0 0 0 0 0 0 1 1 0 0 0 0 0 0 0 |
| 234 | 0 0 0 0 0 0 1 0 1 0 0 0 0 0 0 |
| 236 | 0 0 0 0 0 0 1 0 0 1 0 0 0 0 0 |
| 224 | 0 0 0 0 0 0 1 0 0 0 1 0 0 0 0 |
| 248 | 0 0 0 0 0 0 1 0 0 0 0 1 0 0 0 |
| 200 | 0 0 0 0 0 0 1 0 0 0 0 0 1 0 0 |
| 168 | 0 0 0 0 0 0 1 0 0 0 0 0 0 1 0 |
| 104 | 0 0 0 0 0 0 1 0 0 0 0 0 0 0 1 |
| 162 | 1 1 0 0 0 0 0 0 0 0 0 0 0 0 0 |
| 55 | 1 0 1 0 0 0 0 0 0 0 0 0 0 0 0 |
| 149 | 0 1 1 0 0 0 0 0 0 0 0 0 0 0 0 |
| 204 | 1 0 0 1 0 0 0 0 0 0 0 0 0 0 0 |
| 110 | 0 1 0 1 0 0 0 0 0 0 0 0 0 0 0 |
| 251 | 0 0 1 1 0 0 0 0 0 0 0 0 0 0 0 |
| 235 | 1 0 0 0 1 0 0 0 0 0 0 0 0 0 0 |
| 73 | 0 1 0 0 1 0 0 0 0 0 0 0 0 0 0 |
| 220 | 0 0 1 0 1 0 0 0 0 0 0 0 0 0 0 |
| 39 | 0 0 0 1 1 0 0 0 0 0 0 0 0 0 0 |
| 165 | 1 0 0 0 0 1 0 0 0 0 0 0 0 0 0 |
| 7 | 0 1 0 0 0 1 0 0 0 0 0 0 0 0 0 |
| 146 | 0 0 1 0 0 1 0 0 0 0 0 0 0 0 0 |
| 105 | 0 0 0 1 0 1 0 0 0 0 0 0 0 0 0 |
| 78 | 0 0 0 0 1 1 0 0 0 0 0 0 0 0 0 |
| 57 | 1 0 0 0 0 0 1 0 0 0 0 0 0 0 0 |
| 155 | 0 1 0 0 0 0 1 0 0 0 0 0 0 0 0 |
| 14 | 0 0 1 0 0 0 1 0 0 0 0 0 0 0 0 |
| 245 | 0 0 0 1 0 0 1 0 0 0 0 0 0 0 0 |
| 210 | 0 0 0 0 1 0 1 0 0 0 0 0 0 0 0 |
| 156 | 0 0 0 0 0 1 1 0 0 0 0 0 0 0 0 |

*Syndrome values not in the table correspond to a zero error vector.

The following describes a possible decoder implementation of a (13,8) enhanced Hamming code. After receiving a possibly distorted codeword $\tilde{c}$, compute the syndrome of the enhanced Hamming code by a modulo 2 matrix multiplication $s=H\tilde{c}$, where s is a 5-bit binary vector. Use s as the index to perform a (32×13) table lookup operation. The table of error patterns is described in Table 4. Table 4 shows the error pattern for different syndromes s for the (13,8) enhanced Hamming code

TABLE 4

| s (Decimal Value of an 5-Bit Binary Vector) | Error Pattern e |
|---|---|
| 0 | 0 0 0 0 0 0 0 0 0 0 0 0 0 |
| 1 | 0 0 0 0 0 0 0 0 1 0 0 0 0 |
| 2 | 0 0 0 0 0 0 0 0 0 1 0 0 0 |
| 3 | 0 0 0 0 0 0 0 0 0 1 1 0 0 0 |
| 4 | 0 0 0 0 0 0 0 0 0 0 1 0 0 |
| 5 | 0 0 0 0 0 0 1 1 0 0 0 0 0 |
| 6 | 0 0 0 0 0 0 0 0 0 1 1 0 0 |
| 7 | 0 0 0 0 1 1 0 0 0 0 0 0 0 |
| 8 | 0 0 0 0 0 0 0 0 0 0 0 1 0 |
| 9 | 0 0 0 0 0 0 0 0 0 0 0 0 0 |
| 10 | 0 0 0 0 0 1 0 0 0 0 0 0 0 |
| 11 | 0 0 1 0 0 0 0 0 0 0 0 0 0 |
| 12 | 0 0 0 0 0 0 0 0 0 0 1 1 0 |
| 13 | 0 0 0 0 1 0 0 0 0 0 0 0 0 |
| 14 | 1 0 0 0 0 0 0 0 0 0 0 0 0 |
| 15 | 0 0 0 0 0 0 0 0 0 0 0 0 0 |
| 16 | 0 0 0 0 0 0 0 0 0 0 0 0 1 |
| 17 | 0 0 0 0 0 0 1 0 0 0 0 0 0 |
| 18 | 0 0 0 1 0 0 0 0 0 0 0 0 0 |
| 19 | 1 1 0 0 0 0 0 0 0 0 0 0 0 |
| 20 | 0 0 0 0 0 0 0 1 0 0 0 0 0 |
| 21 | 0 0 0 0 0 0 0 1 1 0 0 0 0 |
| 22 | 0 1 1 0 0 0 0 0 0 0 0 0 0 |
| 23 | 0 0 0 0 0 0 0 0 0 0 0 0 0 |
| 24 | 0 0 0 0 0 0 0 0 0 0 0 1 1 |
| 25 | 0 0 1 1 0 0 0 0 0 0 0 0 0 |
| 26 | 0 0 0 0 0 0 0 0 0 0 0 0 0 |
| 27 | 0 0 0 0 0 1 1 0 0 0 0 0 0 |
| 28 | 0 0 0 0 0 0 0 0 0 0 0 0 0 |
| 29 | 0 1 0 0 0 0 0 0 0 0 0 0 0 |
| 30 | 1 0 0 0 0 0 0 0 0 0 0 0 1 |
| 31 | 0 0 0 1 1 0 0 0 0 0 0 0 0 |

After finding the error vector e, the original codeword can be computed as $c=\tilde{c}+e$, where + is the modulo 2 addition. The first 8 bits in c are the original information bits.

Figure 29A:
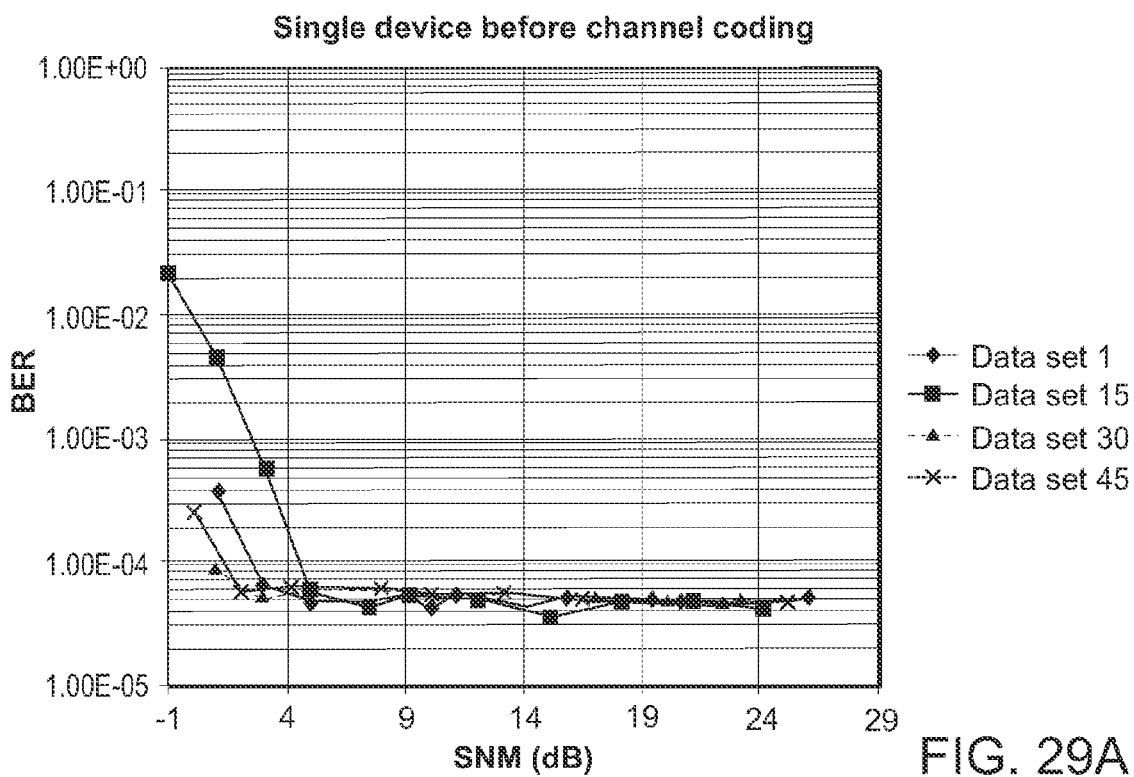
FIGS. 29A-29B are graphs illustrating the performance of the single device BER before and after channel decoding.
Figure 29B:
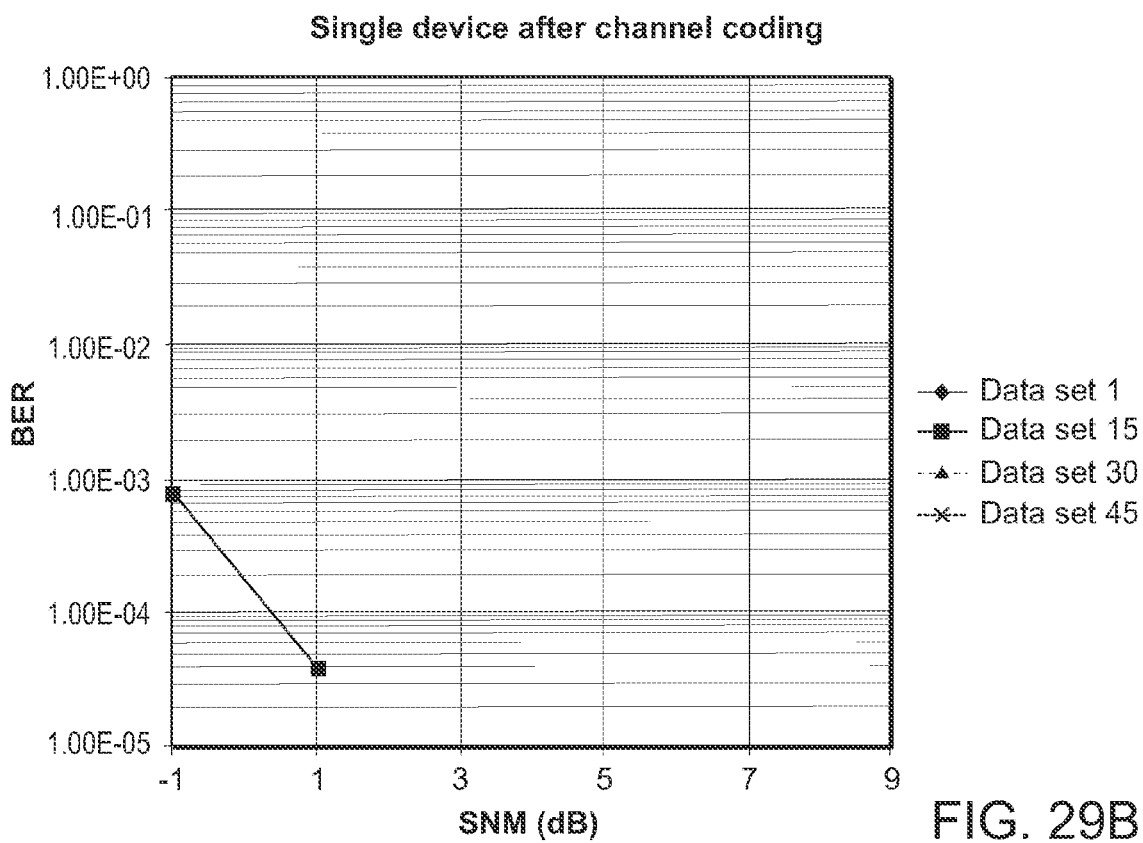
Figure 30A:
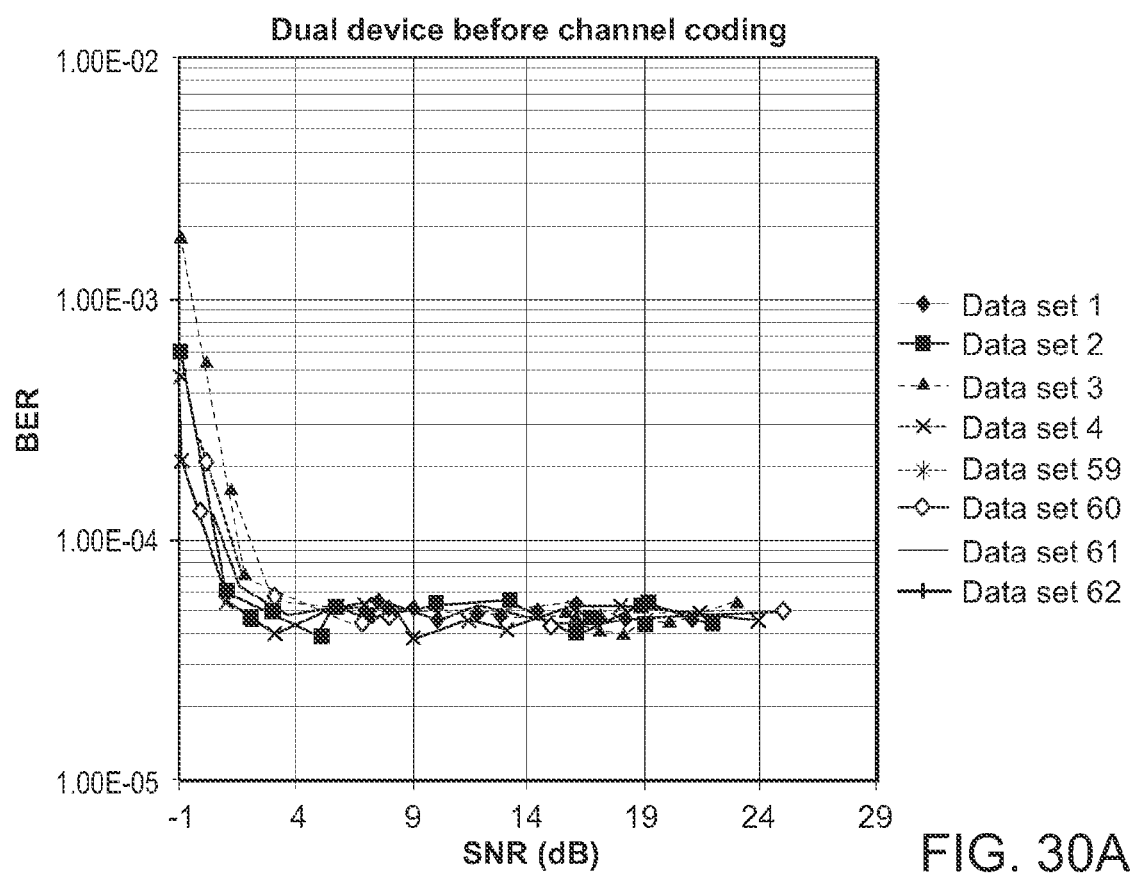
FIGS. 30A-30B are graphs illustrating the; and the performance of the dual device BER before and after channel decoding.
Figure 30B:
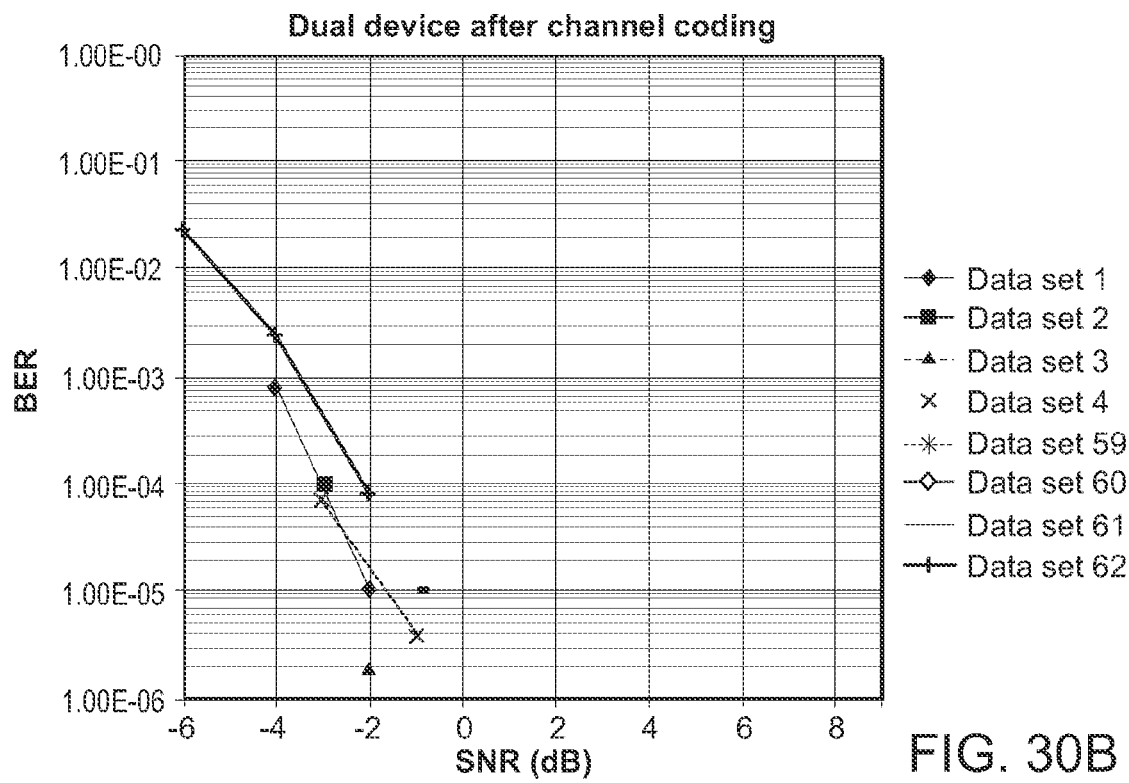
Figure 31A:
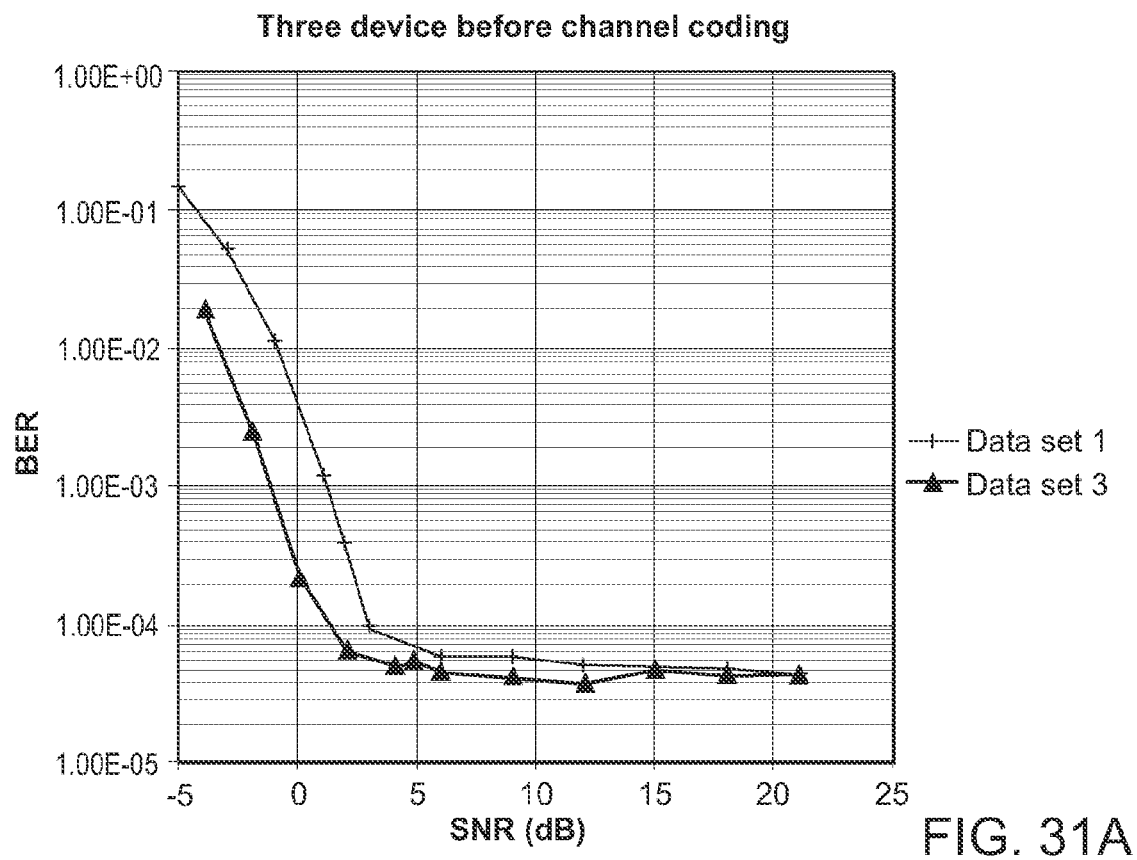
FIGS. 31A-31B are graphs illustrating the performance of the three devices BER before and after channel decoding.
Figure 31B:
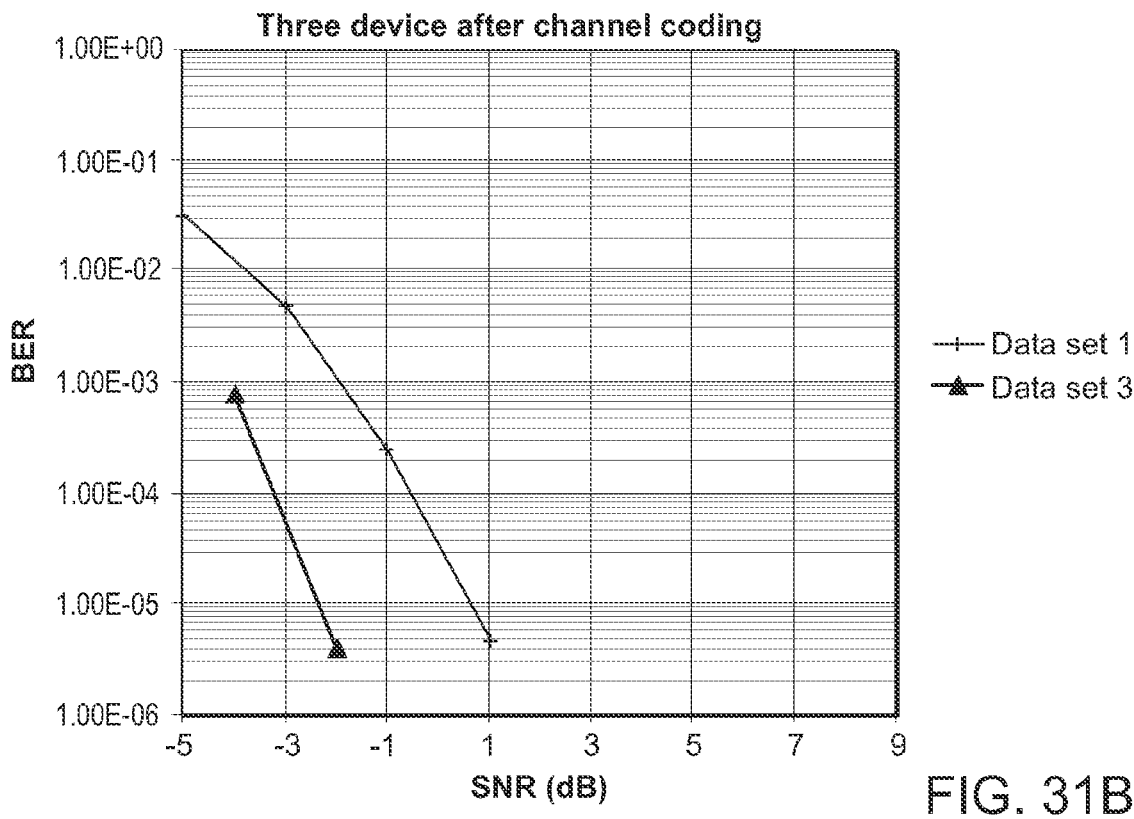

FIGS. 29A-29B show the experimental results for single device case that the inventive receiver design meets the requirements of a BER $<10^{-5}$ at the operating points. FIGS. 30A-30B shows the results for a dual device case that the inventive receiver design meets the requirements of a BER $<10^{-5}$ at the operating points. While FIGS. 31A-31B shows the results for three device case that the inventive receiver design meets the requirements of a BER $<10^{-5}$ at the operating points.

Figure 33:
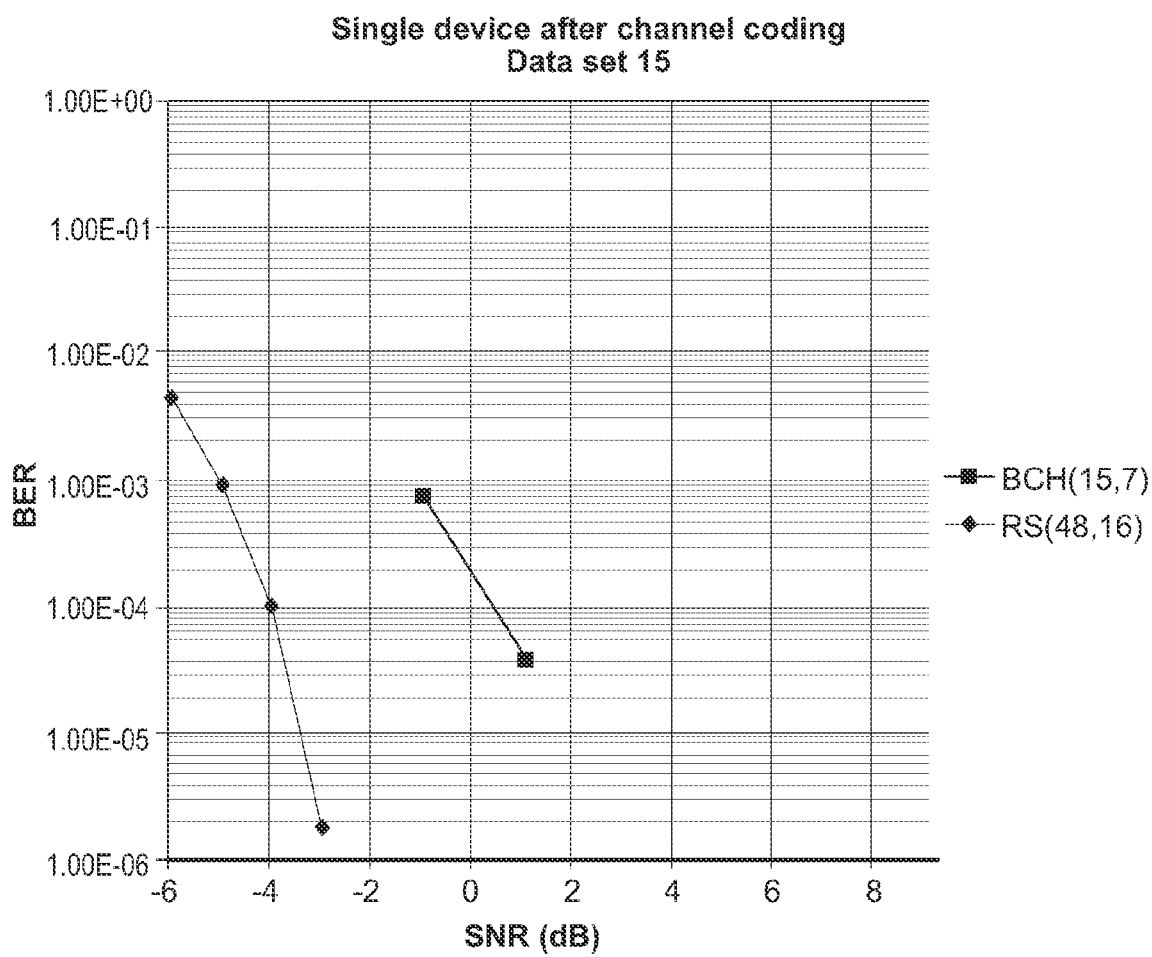
FIG. 33 is a graph illustrating the performing results for single device case where the inventive receiver design includes an alternative channel decoder scheme that does both error correction and detection without the requirement of having a CRC check.
Figure 34:
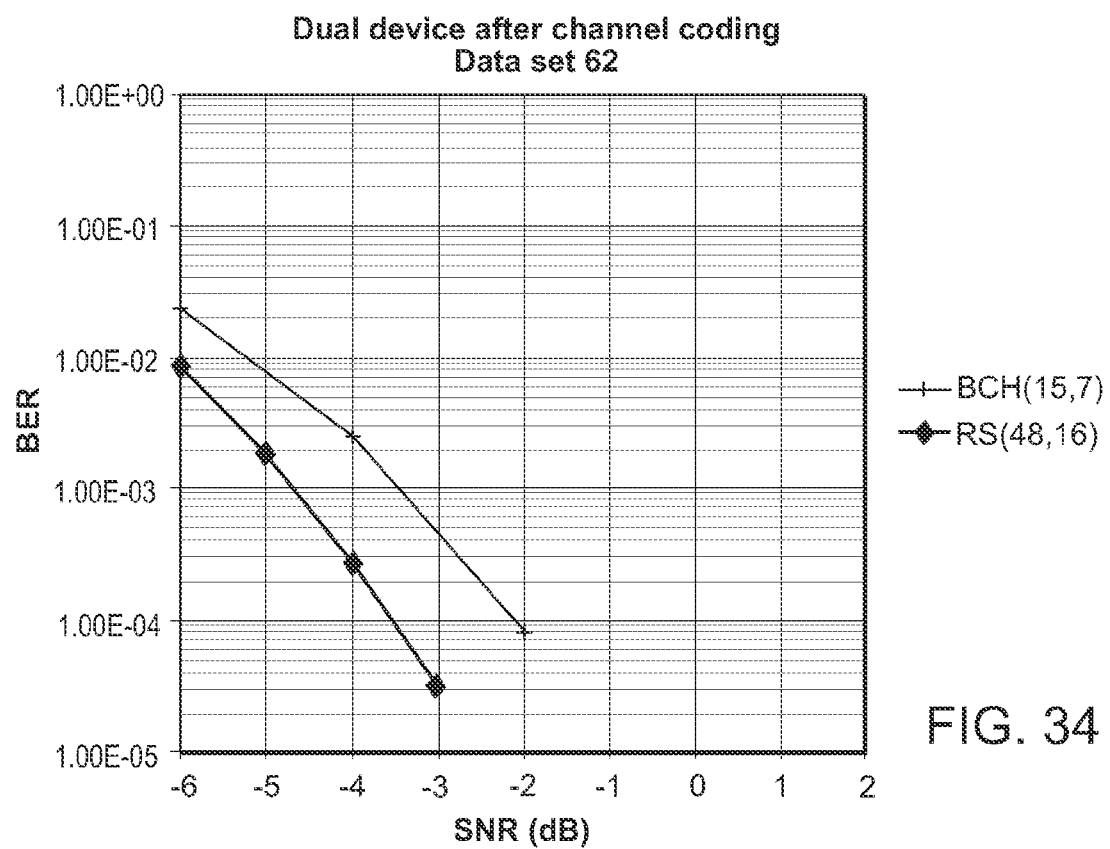
FIG. 34 is a graph illustrating the performing results for two devices case where the inventive receiver design includes an alternative channel decoder scheme that does both error correction and detection without the requirement of having a CRC check.
Figure 35:
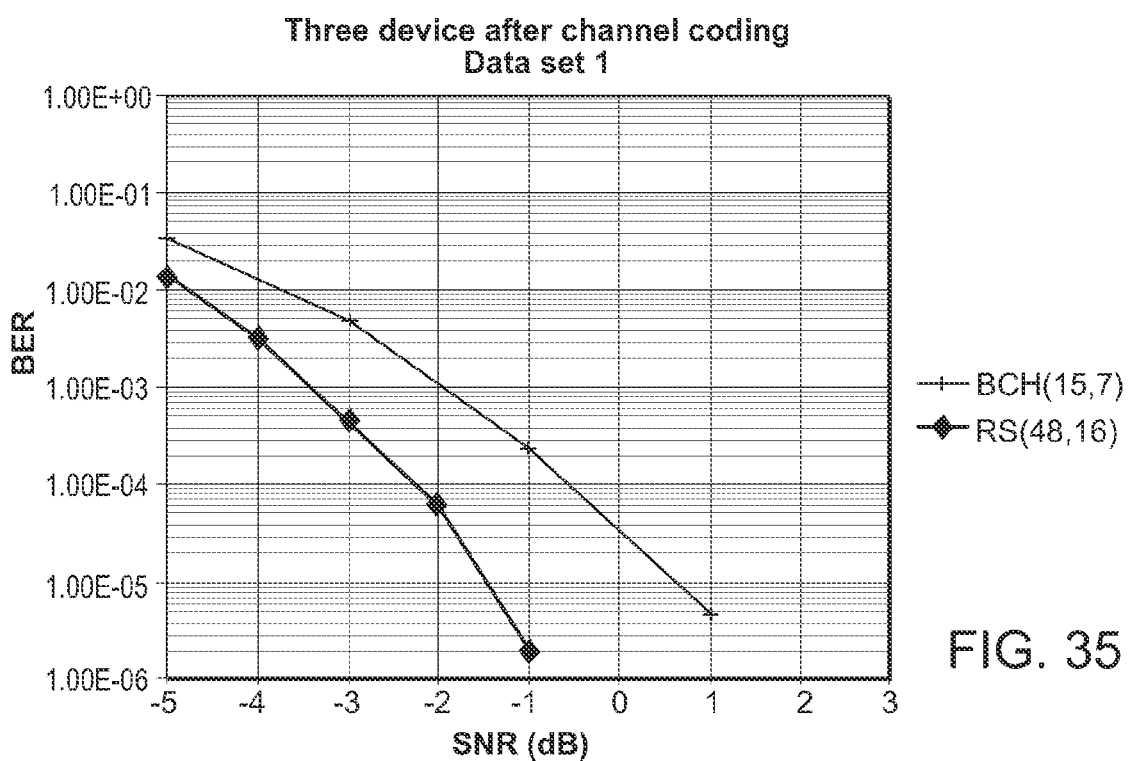
FIG. 35 is a graph illustrating the performing results for three devices case where the inventive receiver design includes an alternative channel decoder scheme that does both error correction and detection without the requirement of having a CRC check.

FIGS. 33-35 shows the performance results for one, two and three device cases where the inventive receiver design includes the aforementioned alternative channel decoder scheme that does both error correction and detection without the requirement of having a CRC check for error detection that meets the requirements of a BER $<10^{-5}$.

Although the present invention has been shown and described with respect to several preferred embodiments thereof, various changes, omissions and additions to the form and detail thereof, may be made therein, without departing from the spirit and scope of the invention.

What is claimed is:

1. A wireless charging in-band communication system comprising:
  a load device including a first coil and a switched impedance coupled in parallel with the first coil, the load device being configured to transmit a message packet at least in part by:
    generating a preamble comprising a synchronization sequence that has no more than three consecutive "1" states,
    encoding a payload according to a channel encoding scheme to generate an encoded payload,
    applying a modulation scheme that ensures no more than three consecutive "1" states are transmitted to the encoded payload to generate a modulated payload without applying the modulation scheme to the preamble,
    inverting the preamble to generate an inverted preamble, and
    transmitting the inverted preamble and the modulated payload by controlling the switched impedance to change a reflected impedance seen by another device electromagnetically coupled to the first coil; and a source device including a second coil configured to electromagnetically couple to the first coil, the source device being configured to receive the message packet from the load device at least in part by detecting changes in the reflected impedance of the load device and decode the encoded payload.

2. The wireless charging in-band communication system of claim 1, wherein the source device comprises a front end filter including downsampling and pulse shaping filters having a plurality of filters sections.

3. The wireless charging in-band communication system of claim 2, wherein the source device comprises an impedance sensing circuit to detect changes in the reflect impedance and wherein an input signal from the impedance sensing circuit is oversampled and the downsampling and pulse shaping filters increase the number of effective bits.

4. The wireless charging in-band communication system of claim 1, wherein the source device comprises DC removal block to remove DC components of the encoded message.

5. The wireless charging in-band communication system of claim 1, wherein the channel encoding scheme comprises at least one of a BCH code, an RS code, and a Hamming code for developing a codeword.

6. The wireless charging in-band communication system of claim 5, wherein the codeword comprises information bits and redundant bits.

7. The wireless charging in-band communication system of claim 5, wherein the codeword comprises 15 bits.

8. The wireless charging in-band communication system of claim 1, wherein the modulation scheme is a biphase modulation scheme.

9. The wireless charging in-band communication system of claim 1, wherein the source device comprises a sliding window time correlator or a circular correlator.

10. The wireless charging in-band communication system of claim 1, wherein the synchronization sequence is generated based on Golay complementary codes and wherein the source device comprises an Optimized Golay Correlator (OGC).

11. The wireless charging in-band communication system of claim 1, wherein the load device is further configured to provide a gap between transmission of the inverted preamble and the modulated payload to allow timing adjustments done by the source device to take effect in time for the modulated payload to be received.

12. The wireless charging in-band communication system of claim 8, wherein the source device comprises a front end filter for coarse DC offset removal.

13. The wireless charging in-band communication system of claim 5, wherein the codeword comprises 13 bits.

14. The wireless charging in-band communication system of claim 5, wherein the codeword comprises 48 bits.

15. A method of performing the operations of a wireless charging in-band communication system, the method comprising:
generating, by a load device, a preamble comprising a synchronization sequence that has no more than three consecutive "1" states;
encoding, by the load device, a payload according to a channel encoding scheme;
applying, by the load device, a modulation scheme that ensures no more than three consecutive "1" states are transmitted to the encoded payload to generate a modulated payload without applying the modulation scheme to the preamble;
inverting, by the load device, the preamble to generate an inverted preamble;
transmitting, by the load device, the inverted preamble and the modulated payload at least in part by controlling a switched impedance coupled in parallel with a first coil to change a reflected impedance seen by a source device electromagnetically coupled to the first coil;
receiving, by the source device, the inverted preamble and the modulated payload from the load device using a second coil electromagnetically coupled to the first coil at least in part by detecting changes in a reflected impedance of the load device; and
decoding, by the source device, the modulated payload.

16. The method of claim 15, wherein receiving the inverted preamble and the modulated payload includes filtering a signal with a front end filter that comprises downsampling and pulse shaping filters having a plurality of filters sections.

17. The method of claim 16, wherein detecting changes of the reflected impedance includes detecting changes of the reflected impedance by an impedance sensing circuit and wherein an input signal from the impedance sensing circuit is oversampled and the downsampling and pulse shaping filters increase the number of effective bits.

18. The method of claim 15, wherein receiving the inverted preamble and the modulated payload includes filtering a signal with a front end filter with a DC removal block to remove DC components.

19. The method of claim 15, wherein encoding the payload includes encoding the payload using at least one of a BCH code, an RS code, and a Hamming code for developing a codeword.

20. The method of claim 19, wherein the codeword comprises information bits and redundant bits.

21. The method of claim 19, wherein the codeword comprises 15 bits.

22. The method of claim 15, wherein the modulation scheme is a biphase modulation scheme.

23. The method of claim 15, wherein the source device includes a sliding window time correlator or a circular correlator.

24. The method of claim 15, wherein the synchronization sequence is generated based on Golay complementary codes and wherein receiving the inverted preamble and the encoded payload comprises detecting, by the source device, the synchronization sequence using an Optimized Golay Correlator (OGC).

25. The method of claim 15, further comprising providing a gap between transmission of the inverted preamble and the encoded payload to allow timing adjustments done by the source device take effect in time for the encoded payload to be received.

26. The method of claim 22, wherein receiving the inverted preamble and modulated payload includes filtering a signal by a front end filter for coarse DC offset removal.

27. The method of claim 19, wherein the codeword comprises 13 bits.

28. The method of claim 19, wherein the codeword comprises 48 bits.

29. A load device supporting wireless charging in-band communication with a source device comprising:
a first coil configured to electromagnetically couple to a second coil of the source device;
a transmitter module configured to generate a message packet for transmission at least in part by:
generating a preamble comprising a synchronization code that has no more than three consecutive "1" states, encoding a payload according to a channel coding scheme, applying a modulation scheme to the encoded payload that ensures no more than three consecutive "1" states are to be transmitted without applying the modulation scheme to the preamble, inverting the preamble to generate an inverted preamble, and transmitting the inverted preamble and the modulated payload to the source device, wherein the load device transmits the message packet to the source device at least in part by changing a reflected impedance seen by the source device without interrupting electromagnetic coupling between the first coil and the second coil.

30. A source device supporting wireless charging in-band communication with a load device comprising:

a first coil for electromagnetically coupling to a second coil of the load device;

a sensing circuit for detecting a message packet sent by the load device at least in part by detecting characteristics changes of the load device;

a front end filter for pulse shaping and noise rejection;

a preamble detection block for detecting a preamble in the message packet, the preamble comprising a synchronization sequence having no more than three consecutive "1" states, and wherein the preamble is inverted to generate an inverted preamble, wherein the preamble detection block comprises a correlator used for message detection, synchronization, and equalization coefficient estimation and selection; and a decoding module for detecting a payload in the message packet modulated by the load device using a modulation scheme that ensures no more than three consecutive "1" states, wherein the modulation scheme is not applied to the inverted preamble by the load device, and performing demodulation with error correction, equalization, and channel decoding on the payload, wherein changing of the characteristics of the load device to transmit the message packet does not interrupt electromagnetic coupling between the first coil and the second coil and wherein the preamble is not modulated using the modulation scheme.

31. The load device of claim 29, wherein the synchronization sequence is generated based on Golay complementary codes.

32. The load device of claim 31, wherein the load and source devices utilize at least one of a BCH code, an RS code, and a Hamming code for developing a codeword.

33. The load device of claim 32, wherein the codeword comprises information bits and redundant bits.

34. The load device of claim 32, wherein the codeword comprises 15 bits.

35. The load device of claim 32, wherein the codeword comprises 48 bits.

36. The source device of claim 30, wherein the sensing circuit is an impedance sensing circuit arranged to detect changes in reflected impedance of the load device and the decoding module performs demodulation with error correction with a DC offset being estimated as the average value of the signal over the length of the message before channel decoding.

37. The source device of claim 36, wherein the load and source devices utilize at least one of a BCH code, an RS code, and a Hamming code for developing a codeword.

38. The source device of claim 37, wherein the codeword comprises information bits and redundant bits.

39. The source device of claim 37, wherein the codeword comprises 15 bits.

40. The source device of claim 37, wherein the codeword comprises 48 bits.

41. A load device supporting wireless charging in-band communication with a source device comprising:

a passive component for electromagnetically coupling with a passive component of the source device and receiving power from the source device; and a switch coupled to the passive component, wherein a load impedance of the load device is varied by controlling the switch, such that a message packet is transmitted to the source device, the message packet having no more than three consecutive "1" states and comprising:

a payload modulated in accordance with a modulation scheme that ensures no more than three consecutive "1" states are transmitted; and a preamble including a synchronization sequence that has no more than three consecutive "1" states, wherein the preamble is not modulated in accordance with the modulation scheme, and wherein the preamble is inverted to generate an inverted preamble, wherein the message packet is transmitted to the source device without interrupting the electromagnetic coupling between the passive component of the load device and the passive component of the source device.

42. A source device supporting wireless charging in-band communication with a load device comprising:

a passive component for electromagnetically coupling with a passive component of the load device and providing power to the load device;

a sensing circuit for receiving a message packet transmitted from the load device by detecting characteristics changes of the load device, the message packet comprising:

a payload modulated in accordance with a modulation scheme that ensures no more than three consecutive "1" states are transmitted; and a preamble including a synchronization sequence that has no more than three consecutive "1" states, wherein the preamble is not modulated in accordance with the modulation scheme, and wherein the preamble is inverted to generate an inverted preamble; and a decoding module for performing demodulation on the payload, wherein changing of the characteristics of the load device to transmit the message packet does not interrupt the electromagnetic coupling between the passive component of the load device and the passive component of the source device.

43. The load device of claim 29, further comprising a switched impedance coupled in parallel with the first coil and wherein the load device is configured to transmit the message packet at least in part by controlling the switched impedance.

44. The source device of claim 30, further comprising a power supply for providing a supply current to the second coil and wherein the sensing circuit is configured to detect characteristics changes of the load device at least in part by sensing a magnitude of the supply current.

45. The load device of claim 41, wherein the switch is coupled in parallel with the passive component of the load device.

46. The source device of claim 42, further comprising a power supply for providing a supply current to the passive component of the source device and wherein the sensing circuit is configured to receive the modulated signal at least in part by sensing a magnitude of the supply current.

\* \* \* \* \*